(12) United States Patent
Lee et al.

(10) Patent No.: US 11,963,426 B2
(45) Date of Patent: Apr. 16, 2024

(54) DISPLAY DEVICE INCLUDING FINGERPRINT RECOGNITION FUNCTION

(71) Applicant: Samsung Display Co., Ltd., Yongin-Si (KR)

(72) Inventors: Dae-Young Lee, Seoul (KR); Gee-Bum Kim, Seoul (KR); Byung Han Yoo, Suwon-si (KR); Sangwoo Kim, Seoul (KR); Jungha Son, Yongin-si (KR); Taekyung Ahn, Yongin-si (KR); Yunjong Yeo, Hwaseong-si (KR); Kijune Lee, Yongin-si (KR); Jaeik Lim, Hwaseong-si (KR); Min Oh Choi, Yongin-si (KR); Chaungi Choi, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 90 days.

(21) Appl. No.: 16/904,913

(22) Filed: Jun. 18, 2020

(65) Prior Publication Data

US 2021/0043875 A1 Feb. 11, 2021

(30) Foreign Application Priority Data

Aug. 8, 2019 (KR) .................. 10-2019-0096844

(51) Int. Cl.
*H10K 59/65* (2023.01)
*G06V 40/13* (2022.01)
*H10K 50/86* (2023.01)
*H10K 59/40* (2023.01)

(52) U.S. Cl.
CPC ............. *H10K 59/65* (2023.02); *G06V 40/13* (2022.01); *G06V 40/1306* (2022.01); *H10K 50/865* (2023.02); *H10K 59/40* (2023.02)

(58) Field of Classification Search
CPC .......... H01L 27/14678; H01L 27/3264; H01L 27/3227; H01L 27/14665; H01L 27/14667; H01L 27/14669; H01L 27/3234; H10K 39/34; H10K 59/60; H10K 59/65

See application file for complete search history.

(56) References Cited

U.S. PATENT DOCUMENTS

| 8,917,387 | B1 | 12/2014 | Lee et al. |
| 9,934,418 | B2 | 4/2018 | Mienko et al. |
| 9,996,198 | B2 | 6/2018 | Zhang |

(Continued)

FOREIGN PATENT DOCUMENTS

| KR | 10-2018-0005588 | 1/2018 |
| KR | 10-2019-0015155 | 2/2019 |

OTHER PUBLICATIONS

Aurent Frey, "Color filters including infrared cut-off integrated on CMOS image sensor", Optics express, vol. 19, pp. 13073, 2011.

*Primary Examiner* — Jesse Y Miyoshi
(74) *Attorney, Agent, or Firm* — F. Chau & Associates, LLC

(57) ABSTRACT

A display device includes a sensor having a detection electrode. An optical pattern layer is disposed directly on the sensor and includes a plurality of transmission portions and a light blocking portion. A display panel is disposed on the optical pattern layer. A minimum distance between the detection electrode and the light blocking portion is in a range of 1 micrometer-5 micrometers.

20 Claims, 15 Drawing Sheets

(56) References Cited

U.S. PATENT DOCUMENTS

| | | |
|---|---|---|
| 10,083,335 B2 | 9/2018 | Zhang |
| 2014/0327799 A1* | 11/2014 | Takahashi ......... H01L 27/14689 |
| | | 438/73 |
| 2018/0012069 A1 | 1/2018 | Chung et al. |
| 2018/0175125 A1* | 6/2018 | Chung ................... G06V 40/70 |
| 2018/0260602 A1 | 9/2018 | He et al. |
| 2019/0095674 A1* | 3/2019 | Ko ........................ H01L 27/323 |
| 2020/0160026 A1* | 5/2020 | Chao ................... H01L 27/1463 |
| 2020/0403168 A1* | 12/2020 | Li ....................... H01L 27/3276 |

* cited by examiner

DISPLAY DEVICE INCLUDING FINGERPRINT RECOGNITION FUNCTION

CROSS-REFERENCE TO RELATED APPLICATIONS

This application claims priority under 35 U.S.C. § 119 to Korean Patent Application No. 10-2019-0096844, filed on Aug. 8, 2019 in the Korean Intellectual Property Office, the disclosure of which is incorporated by reference in its entirety herein.

1. TECHNICAL FIELD

The present disclosure relates to a display device including a fingerprint recognition function.

2. DISCUSSION OF RELATED ART

Display devices generate an image in a display area and may provide various functions for communicating with a user, such as providing visual information to the user or sensing an input from the user. Some recent display devices include a function for detecting a user's fingerprint. Fingerprint recognition methods that are employed include a capacitive method for detecting a change in capacitance formed between electrodes, an optical method for detecting the incident light using an optical sensor, and an ultrasonic method for detecting vibration by using a piezoelectric material. Some recent display devices include a detection unit for fingerprint recognition that is disposed on a rear surface of the display panel.

SUMMARY

Embodiments of the present inventive concepts provide a display device including a detection unit with improved fingerprint recognition sensitivity.

According to an embodiment of the present inventive concepts, a display device includes a sensor having a detection electrode. An optical pattern layer is disposed on the sensor and includes a plurality of transmission portions and a light blocking portion. A display panel is disposed on the optical pattern layer. A minimum distance between the detection electrode and the light blocking portion is in a range of 1 micrometer-5 micrometers.

In an embodiment, a height of the light blocking portion may be 1/tan(AG) times or more of a width of each of the plurality of transmission portions and five times or less of the width of each of the plurality of transmission portions, wherein AG may be an angle set by design conditions.

In an embodiment, the optical pattern layer may further include a transmission layer disposed between the plurality of transmission portions and the sensor and between the light blocking portion and the sensor.

In an embodiment, the transmission layer may include the same material as the plurality of transmission portions.

In an embodiment, an angle between a bottom surface of the light blocking portion and a side surface of the light blocking portion may be 85 degrees or more and 90 degrees or less or 90 degrees or more and 95 degrees or less.

In an embodiment, the plurality of transmission portions may be arranged along a first direction and a second direction on a plane, and the light blocking portion may surround the plurality of transmission portions.

In an embodiment, the plurality of transmission portions may include first transmission portions constituting a first transmission arrangement and second transmission portions constituting a second transmission arrangement, wherein the first transmission portions and the second transmission portions may be arranged along a first direction, wherein the first transmission arrangement and the second transmission arrangement may be alternately arranged along a second direction intersection the first direction, wherein centers of the first transmission portions may non-overlap centers of the second transmission portions in the second direction.

In an embodiment, the plurality of transmission portions may include a central transmission portion and six peripheral transmission portions adjacent to the central transmission portion and spaced at the same pitch from the central transmission portion.

In an embodiment, the display device may further include an additional optical pattern layer disposed on the optical pattern layer and including a plurality of additional transmission portions and an additional light blocking portion.

In an embodiment, each of the plurality of transmission portions may extend along a first direction, and each of the plurality of additional transmission portions may extend along a second direction intersecting the first direction.

In an embodiment, the detection electrode may overlap X or more transmission portions among the plurality of transmission portions on a plane (X is a positive integer).

In an embodiment, the display panel may include: a base layer; a circuit layer disposed on the base layer and including a pixel circuit; and a light emitting element layer disposed on the circuit layer, and including a first electrode, a light emitting layer, and a second electrode, wherein the first electrode and the second electrode may have transparency, and the first electrode may overlap at least Y transmission portions among the plurality of transmission portions (Y is a positive integer).

In an embodiment, the number of transmission portions overlapping the detection electrode among the plurality of transmission portions may be greater than the number of transmission portions overlapping the first electrode among the plurality of transmission portions.

In an embodiment, the display device may further include an infrared filter disposed between the display panel and the optical pattern layer.

In an embodiment, an active area for displaying an image and a peripheral area surrounding the active area may be defined in the display panel, wherein a detection area for detecting biometric information may be defined in the sensor, wherein the detection area may overlap an entire of the active area.

In an embodiment of the present inventive concepts, a display device includes a detection unit having a sensor that includes a detection electrode and an optical pattern layer that is disposed on the sensor and includes a plurality of transmission portions and a light blocking portion adjacent to the plurality of transmission portions. A display panel is disposed on the detection unit and includes a light emitting element layer having a first electrode, a light emitting layer, and a second electrode. Each of the first electrode and the detection electrode overlaps two or more transmission portions among the plurality of transmission portions.

In an embodiment, a minimum distance between the detection electrode and the light blocking portion may be 1 micrometer or more and 5 micrometers or less.

In an embodiment, the optical pattern layer may further include a transmission layer disposed between the plurality of transmission portions and the sensor and between the light blocking portion and the sensor, wherein the transmission layer may include the same material as the plurality of transmission portions.

In an embodiment, a height of the light blocking portion may be 1/tan(AG) times or more a width of each of the plurality of transmission portions and five times or less of the width of each of the plurality of transmission portions, wherein AG may be an angle set by design conditions, wherein an angle between a bottom surface of the light blocking portion and a side surface of the light blocking portion may be 85 degrees or more and 90 degrees or less or 90 degrees or more and 95 degrees or less.

In an embodiment, the plurality of transmission portions may include a central transmission portion and six peripheral transmission portions adjacent to the central transmission portion and spaced at the same pitch from the central transmission portion.

In an embodiment of the present inventive concepts, a display device includes a display panel having a plurality of pixel areas including a first pixel area, a second pixel area and a third pixel area. Each of the plurality of pixel areas has a pixel that includes a first electrode, a light emitting layer and a second electrode. A detection unit is disposed under the display panel. The detection unit has a sensor that includes a detection element. The detection unit forms a detection area overlapping the detection element and a valid detection area overlapping an area that a transistor is electrically connected to the detection element. An optical pattern layer is disposed on the sensor and includes a plurality of transmission portions and a light blocking portion adjacent to the plurality of transmission portions. The detection area overlaps the plurality of transmission portions and a portion of each of the first pixel area, second pixel area and third pixel area. The first electrodes of the first pixel area, second pixel area and third pixel area overlap the plurality of transmission portions. An area of each of the first to third pixel areas is less than an area of the detection area and a number of transmission portions overlapping the first electrodes of the first pixel area, second pixel area and third pixel area, respectively, is less than a number of transmission portions overlapping the detection area.

BRIEF DESCRIPTION OF THE DRAWINGS

The accompanying drawings are included to provide a further understanding of embodiments of the present inventive concepts, and are incorporated in and constitute a part of this specification. The drawings illustrate embodiments of the present inventive concepts and, together with the description, serve to explain principles of the inventive concepts. In the drawings.

DETAILED DESCRIPTION OF EMBODIMENTS

Figure 1:
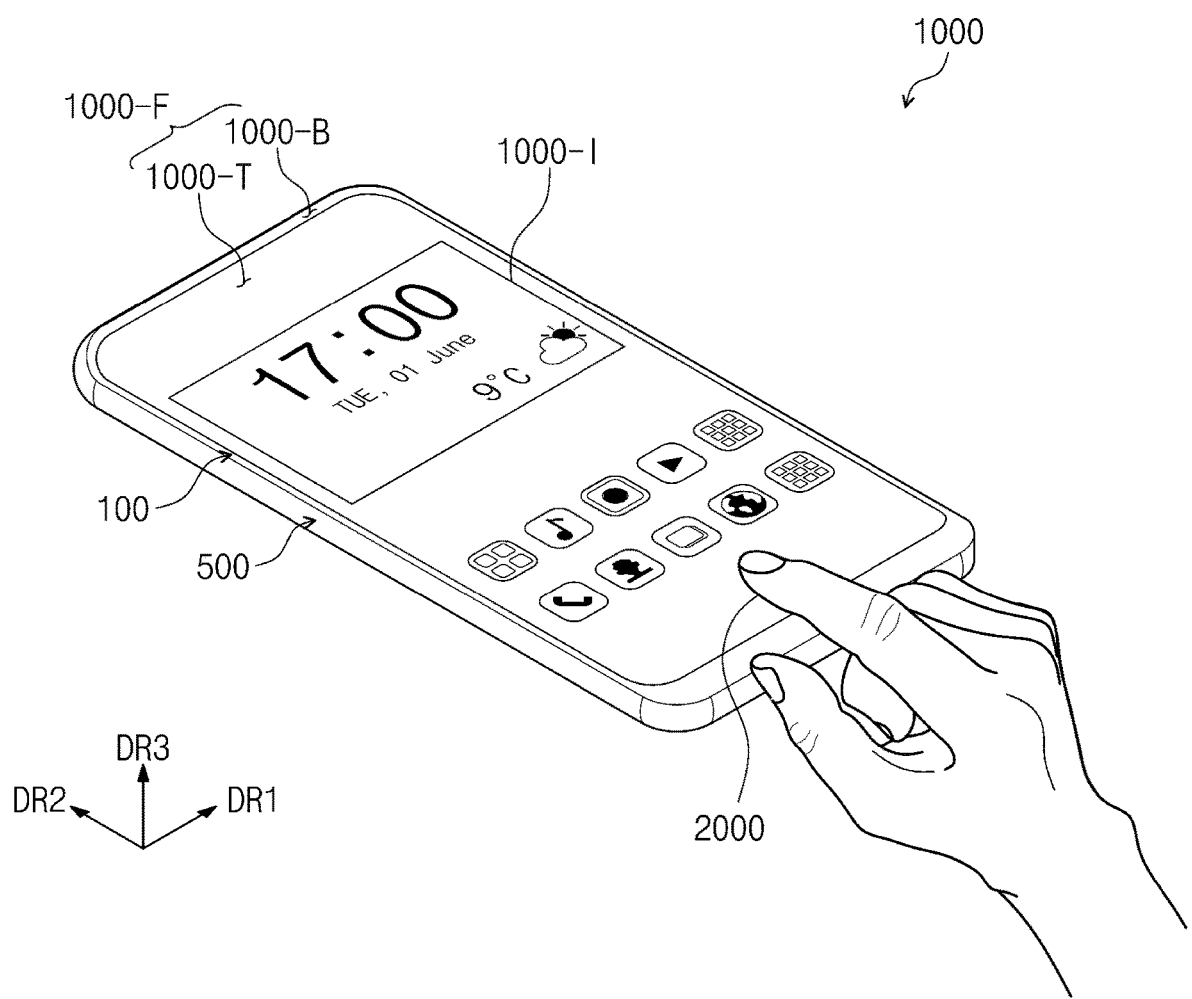
FIG. 1 is a perspective view of a display device according to an embodiment of the present inventive concepts.

In this specification, when a component (or an area, a layer, a part, etc.) is referred to as being "on", "connected to" or "combined to" another component, this means that the component may be directly on, connected to, or combined to the other component or an intervening component may be therebetween. When a component (or an area, a layer, a part, etc.) is referred to as being "directly on", "directly connected to" or "directly combined to" another component, this means that the component is directly on, connected to, or combined to the other component with no intervening component therebetween.

Like reference numerals refer to like elements. Additionally, in the drawings, the thicknesses, proportions, and dimensions of components are exaggerated for effective description.

"And/or" includes all of one or more combinations defined by related components.

It will be understood that the terms "first" and "second" are used herein to describe various components but these components should not be limited by these terms. The above terms are used only to distinguish one component from another. For example, a first component may be referred to as a second component and vice versa without departing from the scope of the present inventive concepts. The singular expressions include plural expressions unless the context clearly dictates otherwise.

In addition, terms such as "below", "the lower side", "on", and "the upper side" are used to describe a relationship of configurations shown in the drawing. The terms are described as a relative concept based on a direction shown in the drawing.

Unless otherwise defined, all terms (including technical and scientific terms) used herein have the same meaning as terms commonly understood by those skilled in the art to which the present inventive concepts belong. In general, the terms defined in the dictionary should be considered to have the same meaning as the contextual meaning of the related art, and, unless clearly defined herein, should not be understood abnormally or as having an excessively formal meaning.

In various embodiments of the present inventive concepts, the term "include," "comprise," "including," or "comprising," specifies a property, a region, a fixed number, a step, a process, an element and/or a component but does not exclude other properties, regions, fixed numbers, steps, processes, elements and/or components.

Hereinafter, embodiments of the present inventive concepts will be described with reference to the drawings.

Figure 2:
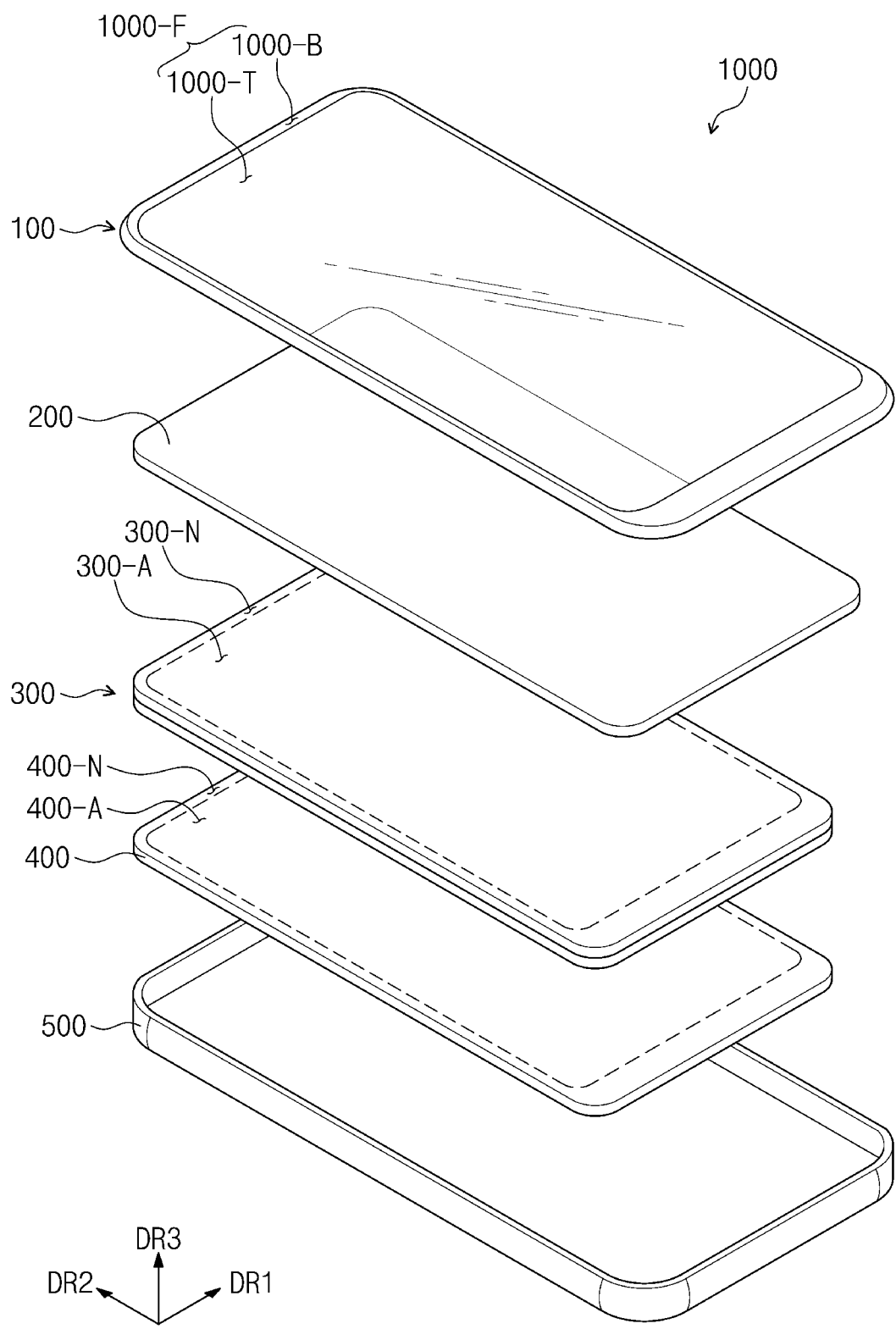
FIG. 2 is an exploded perspective view of a display device according to an embodiment of the present inventive concepts.

FIG. 1 is a perspective view of a display device 1000 according to an embodiment of the present inventive concepts. FIG. 2 is an exploded perspective view of a display device 1000 according to an embodiment of the present inventive concepts.

Referring to FIGS. 1 and 2, the display device 1000 may be a device activated according to an electrical signal that is configured to generate images for display to a user. While the embodiment shown in FIG. 1 includes a smartphone as the display device 1000, embodiments of the present inventive concepts are not limited thereto and the display device 1000 may be various different display devices. For example, the display device 1000 may be medium-sized electronic device such as a personal computers, a notebook computer, a personal digital terminal, a car navigation unit, a game machines, a portable electronic device, or a camera in addition to large-sized electronic devices such as televisions, monitors, or external billboards. However, the display device 1000 may be any other electronic device that includes a display without departing from the scope of the present inventive concepts.

The display device 1000 may display an image 1000-I on a display surface 1000-F. The image 1000-I may be viewable in a third direction DR3 that is perpendicular to a first direction DR1 and a second direction DR2. In an embodiment, the image 1000-I may include at least one still image and/or at least one dynamic images. In FIG. 1, a clock, calendar and temperature window and associated icons are shown as an example of the image 1000-I. The display surface 1000-F on which the image 1000-I is displayed may correspond to the front surface of the display device 1000 and may correspond to the front surface of the window 100.

In the embodiment shown in FIG. 1, the front surface (or upper surface in the third direction DR3) and the rear surface (or lower surface in the third direction DR3) of each member are defined with reference to the direction in which the image 1000-I is displayed. The front surface and the rear surface are opposed to each other in the third direction DR3, and the normal direction of each of the front surface and the rear surface may be parallel to the third direction DR3. In the specification, "when viewed on a plane" may refer to "when viewed in the third direction DR3".

The display device 1000 according to an embodiment of the present inventive concepts may detect a user's input applied from the outside. The user's inputs include various types of external inputs such as touch from a part of the user's body, light, heat, pressure, etc. In addition, the display device 1000 may detect a user input applied to the side surface or the rear surface of the display device 1000 according to the structure of the display device 1000. However, embodiments of the present inventive concepts are not limited thereto.

The display apparatus 1000 may detect a fingerprint 2000 of a user applied from the outside. The fingerprint recognition area may be provided on the display surface 1000-F of the display device 1000. In an embodiment, the fingerprint recognition area may be provided in the entire area of the transmission area 1000-T or in a partial area of the transmission area 1000-T.

As shown in the embodiment of FIG. 2, the display device 1000 may include a window 100, an antireflection panel 200, a display module 300, a detection unit 400, and a housing 500 that are sequentially stacked on each other in the third direction DR3. In an embodiment, the window 100 and the housing 500 may be combined to form an appearance of the display device 1000. While the embodiment of FIGS. 1-2 show the display device 1000 having a rectangular shape, embodiments of the present inventive concepts are not limited thereto and the display device 1000 may have various other shapes, such as a circular shape, a spherical shape, a polygonal shape, etc.

In an embodiment, the window 100 may include an optically transparent insulating material. For example, the window 100 may include glass or plastic. The window 100 may have a multi-layer structure or a single-layer structure. For example, the window 100 may include a plurality of plastic films bonded together with an adhesive, or may include a glass substrate and a plastic film bonded together with an adhesive.

The front surface 1000-F of the window 100 defines the front surface of the display device 1000 as described above. The transmission area 1000-T may be an optically transparent area. For example, in an embodiment, the transmission area 1000-T may be an area having a visible light transmittance of about 90% or more.

The bezel area 1000-B may be an area having a lower light transmittance as compared to the transmission area 1000-T. The bezel area 1000-B defines the shape of the transmission area 1000-T. The bezel area 1000-B may be adjacent to the transmission area 1000-T and may surround the transmission area 1000-T (e.g., in the first direction DR1 and the second direction DR2).

The bezel area 1000-B may have a predetermined color. The bezel area 1000-B may cover the peripheral area 300-N of the display module 300 to block the peripheral area 300-N from being visible from the outside. However, in another embodiments, the window 100 may not include the bezel area 1000-B.

The antireflection panel 200 may be disposed under the window 100. For example, as shown in the embodiment of FIG. 2, the antireflection panel 200 is disposed directly under the window 100 (e.g., in the third direction DR3). The antireflection panel 200 reduces the reflectance of external light incident from the upper side of the window 100. However, in another embodiment of the present inventive concepts, the antireflection panel 200 may be omitted, or may be a configuration included in the display module 30).

The display module 300 is disposed under the antireflection panel 200. For example, as shown in the embodiment of FIG. 2, the display module 300 may be disposed directly under the antireflection panel 200 (e.g., in the third direction DR3). The display module 300 may display an image 1000-I and detect an external input. The display module 300 may include an active area 300-A and a peripheral area 300-N. The active area 300-A may be an area that may be activated according to an electrical signal.

In another embodiment, the active area 300-A may be an area where the image 1000-I is displayed and where an external input is detected at the same time. The transmission area 1000-T of the window 100 may overlap the active area 300-A of the display module 300 (e.g., in the third direction DR3). In an embodiment, the transmission area 1000-T may overlap the entire area or at least a portion of the active area 300-A. Accordingly, the user may view the image 1000-I or provide an external input through the transmission area 1000-T. In an embodiment of the present inventive concepts, an area where the image 1000-I is displayed and an area where an external input is detected may be separate from each other in the active area 300-A. However, embodiments of the present inventive concepts are not limited to any one embodiment.

The peripheral area 300-N may be an area covered by the bezel area 1000-B. The peripheral area 300-N is adjacent to the active area 300-A. The peripheral area 300-N may surround the active area 300-A (e.g., in the first direction DR1 and second direction DR2). A driving circuit, a driving wire, and the like for driving the active area 300-A may be disposed in the peripheral area 300-N.

The detection unit 400 may be disposed below the display module 300. For example, as shown in the embodiment of FIG. 2, the detection unit 400 may be disposed directly under the display module 300 (e.g., in the third direction DR3). The detection unit 400 may be a layer that detects biometric information of the user. The detection unit 400 may detect the surface of the touch target. The surface may have a surface uniformity, a surface curved shape, and the like. For example, in an embodiment in which the detection unit 400 detects the fingerprint 2000 of the user, the detection unit 400 may detect information, such as information concerning ridges and valleys, on the surface of the finger of the user.

The detection unit 400 may include a detection area 400-A and a non-detection area 400-N. The detection area 400-A may be an area activated according to an electrical signal. For example, the detection area 400-A may be an area for detecting biometric information. A driving circuit, a driving wire, and the like for driving the detection area 400-A of the detection unit 400 may be disposed in the non-detection area 400-N.

In an embodiment of the present inventive concepts, the detection area 400-A may overlap (e.g., in the third direction DR3) the entire portion of the active area 300-A of the display module 300. In this embodiment, fingerprint recognition may be possible in the entire active area 300-A. For example, the user's fingerprint 2000 may be recognized in the entire area of the active area 300-A of the display module 300. However, embodiments of the present inventive concepts are not limited thereto. For example, in another embodiment of the present inventive concepts, the detection unit 400 may overlap only a portion of the active area 300-A.

The housing 500 is coupled with the window 100. The housing 500 includes sidewalls extending in the third direction DR3 and a main surface extending in the first direction DR1 and the second direction DR2. The housing 500 is coupled with the window 100 to provide a predetermined inner space. The display module 300 and the detection unit 400 may be accommodated in an internal space. The housing 500 may stably protect the components of the display device 1000 accommodated in the inner space from external impacts. In an embodiment, the housing 500 may include a material having a relatively high stiffness. For example, the housing 500 may include a plurality of frames and/or plates including glass, plastic, or metal, or a combination thereof. However, embodiments of the present inventive concepts are not limited thereto.

A battery module for supplying power for the overall operation of the display device 1000 may be disposed between the detection unit 400 and the housing 500.

Figure 3:
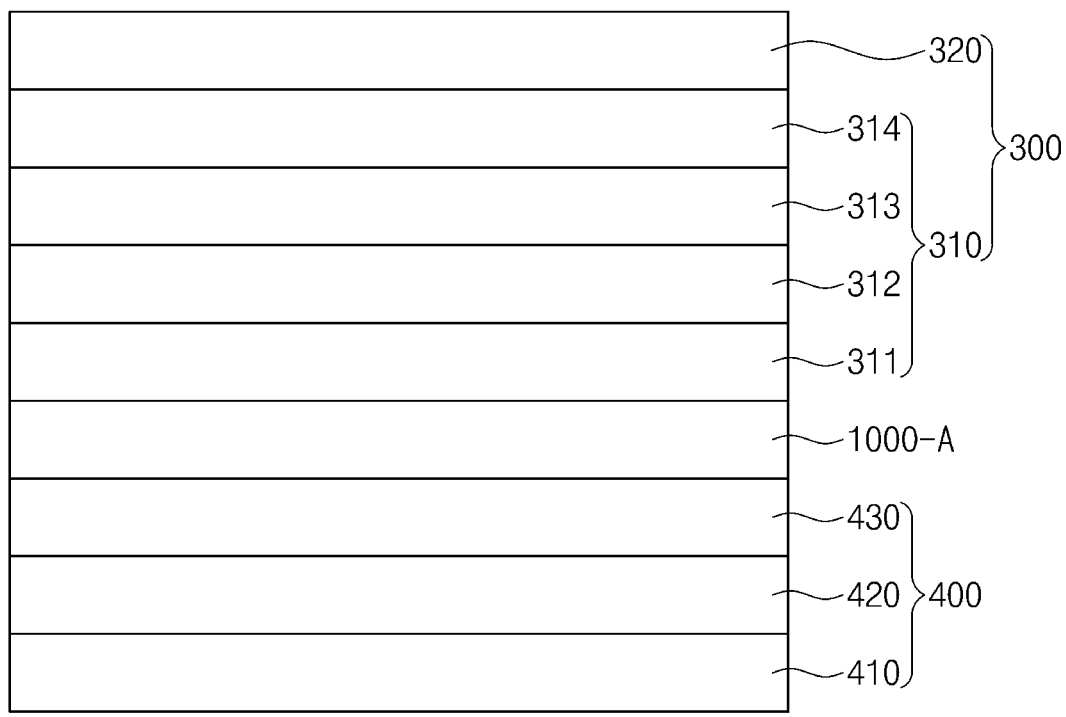
FIG. 3 is a cross-sectional view illustrating a display device according to an embodiment of the present inventive concepts.
Figure 3:
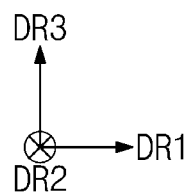

FIG. 3 is a cross-sectional view of a partial configuration of a display device according to an embodiment of the present inventive concepts. FIG. 3 is a schematic cross-sectional view of the components constituting the display module 300 and the detection unit 400.

Referring to FIG. 3, the display module 300 may include a display panel 310 and an input detection layer 320.

The display panel 310 may be a layer for providing an image. The active area 300-A (see FIG. 2) of the display module 300 may correspond to the active area of the display panel 310. In an embodiment, the detection area 400-A (see FIG. 2) of the detection unit 400 may overlap the entire active area of the display panel 310 (e.g., in the third direction DR3).

The display panel 310 may include a base layer 311, a circuit layer 312, a light emitting element layer 313, and an encapsulation layer 314.

In an embodiment, the base layer 311 may include a synthetic resin layer. The synthetic resin layer may include a thermosetting resin. For example, the synthetic resin layer may be a polyimide-based resin layer, and the material thereof is not particularly limited. In an embodiment, the synthetic resin layer may include at least one material selected from acrylic resin, methacrylic resin, polyisoprene, vinyl resin, epoxy resin, urethane resin, cellulose resin, siloxane-based resin, polyamide-based resin, and perylene resin. In addition, the base layer 311 may include a glass substrate, a metal substrate, or an organic/inorganic composite substrate.

The circuit layer 312 may be disposed on the base layer 311 (e.g., in the third direction DR3). The circuit layer 312 may be a layer including a pixel circuit and insulating layers. The pixel circuit may include at least one transistor and at least one capacitor.

The light emitting element layer 313 may be disposed on the circuit layer 312 (e.g., in the third direction DR3). The light emitting element layer 313 may be a layer for generating light. The light emitting element layer 313 may generate light or control the amount of light according to an electrical signal. When the display panel 310 is an organic light emitting display panel, the light emitting element layer 313 may include an organic light emitting material. When the display panel 310 is a quantum dot light emitting display panel, the light emitting element layer 313 may include a quantum dot or a quantum rod. However, embodiments of the present inventive concepts are not limited thereto and the display panel 310 may be various other light emitting element layers, such as an inorganic light emitting element layer, etc.

The encapsulation layer 314 may be disposed over the light emitting element layer 313 (e.g., in the third direction DR3). The encapsulation layer 314 may include at least one insulating layer. For example, the encapsulation layer 314 may include at least one inorganic layer and at least one organic layer. The inorganic layer may protect the light emitting element layer 313 from moisture and oxygen, and the organic layer may protect the light emitting element layer 313 from foreign substances such as dust particles.

The input detection layer 320 may be disposed on the display panel 310 (e.g., in the third direction DR3). The input detection layer 320 may detect an external input to obtain location information of the external input. The input detection layer 320 may detect various types of external inputs. For example, the external inputs may include touch from a part of the user's body, light, heat, pressure, etc. In addition, the input detection layer 320 may detect an input contacting the window 100 (see FIG. 2) or an input close to or adjacent to the window 100.

The input detection layer 320 may be directly disposed on the display panel 310 (e.g., in the third direction DR3). For example, in an embodiment of the present inventive concepts, the input detection layer 320 and the display panel 310 may be formed through a continuous process. However, in another embodiment of the present inventive concepts, the input detection layer 320 may be attached to the display panel 310. In this embodiment, an adhesive layer may be further disposed between the input detection layer 320 and the display panel 310 (e.g., in the third direction DR3).

The detection unit 400 may be disposed below the display module 300. For example, as shown in the embodiment of FIG. 3, the detection unit 400 may be attached to the rear surface of the display panel 310 by an adhesive layer 1000-A that is disposed between the detection unit 400 and the display panel 310 (e.g., in the third direction DR3). In an embodiment, the adhesive layer 1000-A may be an optically transparent adhesive member, and the adhesive layer 1000-A may include a conventional adhesive or gluing agent.

The detection unit 400 may include a base layer 410, a sensor 420, and an optical pattern layer 430.

The base layer 410 may include a synthetic resin layer. The synthetic resin layer may include a thermosetting resin. For example, the synthetic resin layer may be a polyimide-based resin layer, and the material thereof is not particularly limited. For example, the base layer 410 may include two layers of polyimide resin layers and a barrier layer disposed between the polyimide resin layers. The barrier layer may include amorphous silicon and silicon oxide. However, embodiments of the present inventive concepts are not limited thereto.

The sensor 420 may be disposed on the base layer 410. The sensor 420 may be referred to as a sensor layer or a biometric information detection layer. The sensor 420 may include a detection circuit and insulating layers. The detection circuit may include at least one transistor and at least one photodiode.

The optical pattern layer 430 may be disposed directly on the sensor 420. For example, in an embodiment, the optical pattern layer 430 and the sensor 420 may be formed through a continuous process. The optical pattern layer 430 and the sensor 420 may be directly contact each other. That is, a third component such as an adhesive layer may not be disposed between the optical pattern layer 430 and the sensor 420.

The optical pattern layer 430 may filter light incident to the sensor 420. For example, an incidence angle of light that may pass through the optical pattern layer 430 may be controlled by the optical pattern layer 430. For example, the incident angle of light that passes through the optical pattern layer 430 may be limited to a predetermined maximum angle. As the incidence angle of light that passes through the optical pattern layer 430 is limited, the accuracy of fingerprint recognition may be improved.

Figure 4:
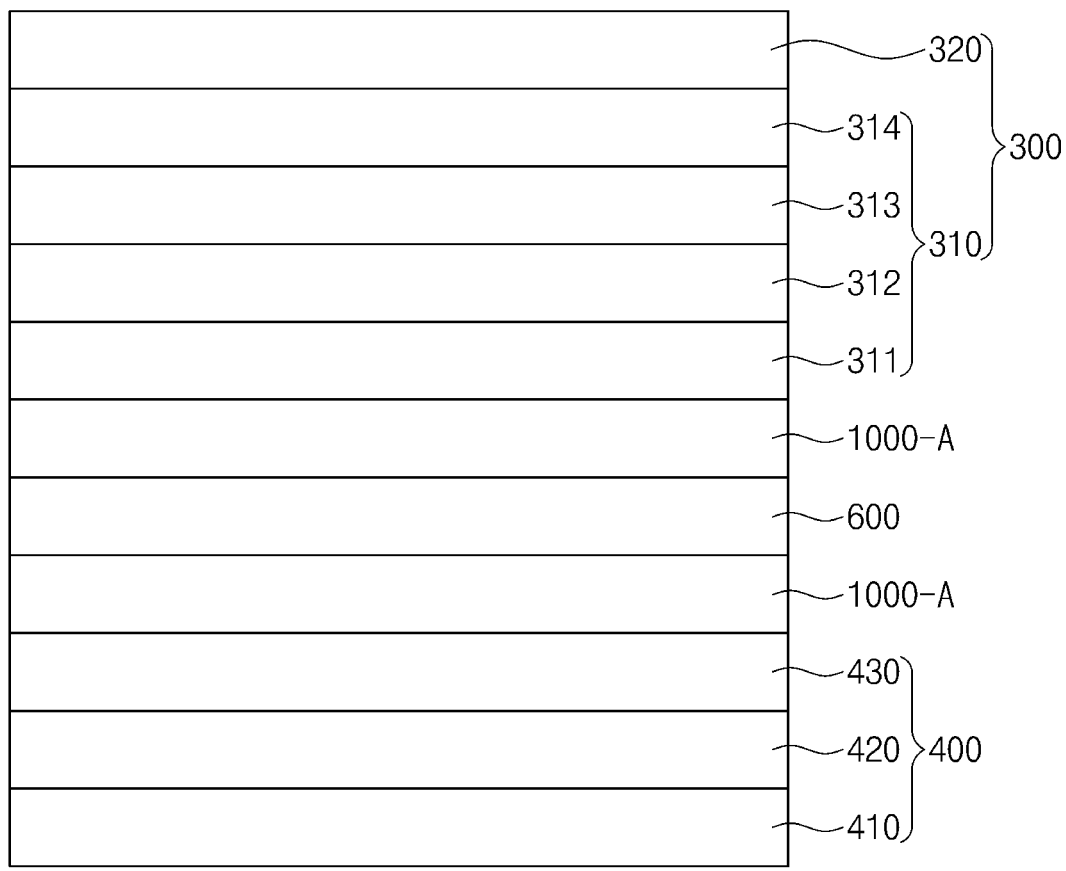
FIG. 4 is a cross-sectional view of a display device according to an embodiment of the present inventive concepts.

FIG. 4 is a schematic cross-sectional view of some components of a display device according to an embodiment of the present inventive concepts. The embodiment of FIG. 4 includes a configuration that is different from the configuration shown in FIG. 3. The differences will be described in detail, and the same reference numerals will be given to the remaining overlapping components, and description thereof will be omitted.

Referring to the embodiment shown in FIG. 4, an infrared filter 60) may be further disposed between the display module 300 and the detection unit 400 (e.g., in the third direction DR3). The infrared filter 600 may be a filter that blocks the transmission of infrared rays and transmits visible light.

Light reflected from the user's fingerprint 2000 (see FIG. 1) may be visible light. According to the embodiment shown in FIG. 4, as the infrared filter 600 blocks light of a wavelength band other than the wavelength band of the light reflected by the fingerprint 2000, the fingerprint recognition accuracy of the sensor 420 may be improved.

An adhesive layer 1000-A may be disposed between the infrared filter 600 and the display module 300 and between the infrared filter 600 and the detection unit 400 (e.g., in the third direction DR3).

Figure 5:
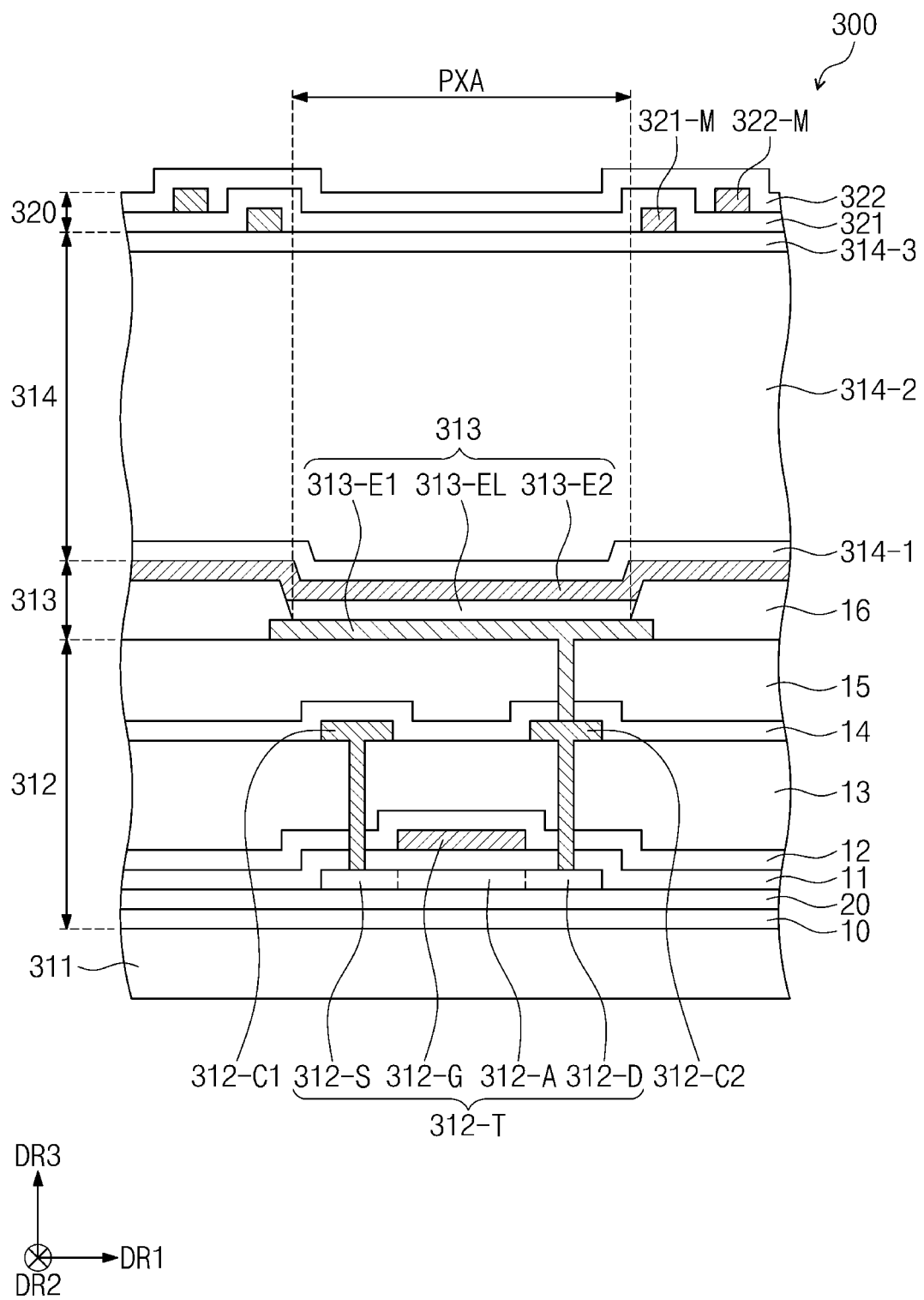
FIG. 5 is a cross-sectional view of a display module according to an embodiment of the present inventive concepts.

FIG. 5 is a cross-sectional view of a display module 300 according to an embodiment of the present inventive concepts.

Referring to the embodiment shown in FIG. 5, a circuit layer 312, a light emitting element layer 313, an encapsulation layer 314, and an input detection layer 320 may be sequentially disposed on the base layer 311 (e.g., in the third direction DR3).

The barrier layer 10 may be disposed on the base layer 311. The barrier layer 10 prevents foreign substances from flowing into the display module 300 from the outside. In an embodiment, the barrier layer 10 may include at least one of a silicon oxide layer and a silicon nitride layer. Each of the silicon oxide layer and silicon nitride layer may be provided in plurality, and the silicon oxide layers and the silicon nitride layers may be alternately stacked.

The buffer layer 20 may be disposed on the barrier layer 10. The buffer layer 20 improves the bonding force between the base layer 311 and the semiconductor pattern and/or the conductive pattern. In an embodiment, the buffer layer 20 may include at least one of a silicon oxide layer and a silicon nitride layer. The silicon oxide layer and the silicon nitride layer may be alternately stacked.

The transistor 312-T of the pixel circuit may be disposed on the buffer layer 20. The transistor 312-T may include an active pattern 312-A, a source 312-S, a drain 312-D, and a gate 312-G.

The semiconductor patterns comprising the source 312-S, the active pattern 312-A, and the drain 312-D are disposed on the buffer layer 20. Hereinafter, the semiconductor patterns directly disposed on the buffer layer 20 may include a silicon semiconductor, a polysilicon semiconductor, or an amorphous silicon semiconductor. The semiconductor patterns have different electrical properties depending on whether they are doped. The semiconductor pattern may include a doping area and a non-doping area. The doping area may be doped with an N type dopant or a P type dopant. The P type transistor includes a doping area doped with a P type dopant.

The doping area has a greater conductivity than the non-doping area and substantially acts as an electrode or signal wiring. The non-doping area is substantially the active pattern (or channel) of the transistor. For example, a portion of the semiconductor patterns 312-S, 312-A, and 312-D may be an active pattern 312-A of the transistor 312-T. Another portion may be the source 312-S or the drain 312-D of the transistor 312-T. Another portion may be a connection signal wiring (or connection electrode).

The first insulating layer 11 is disposed on the buffer layer 20 and covers the semiconductor patterns comprising the source 312-S, the active pattern 312-A, and the drain 312-D. The first insulating layer 11 may be an inorganic layer and/or an organic layer and may have a single layer or multilayer structure. In an embodiment, the first insulating layer 11 may include at least one of aluminum oxide, titanium oxide, silicon oxide, silicon oxynitride, zirconium oxide, and hafnium oxide. For example, the first insulating layer 11 may be a single silicon oxide layer. The inorganic layer to be described later may include at least one of the above materials.

The gate 312-G may be disposed on the first insulating layer 11. The gate 312-G may be part of a metal pattern. The gate 312-G may overlap with the active pattern 312-A (e.g., in the third direction DR3). In the process of doping the semiconductor pattern, the gate 312-G may function as a mask.

The second insulating layer 12 may be disposed on the first insulating layer 11 and cover the gate 312-G. The second insulating layer 12 may be an inorganic layer and may have a single layer or a multilayer structure. In an embodiment, the second insulating layer 12 may be a single silicon oxide layer.

The third insulating layer 13 may be disposed on the second insulating layer 12. In an embodiment, the third insulating layer 13 may be an organic layer and may have a single layer or a multilayer structure. For example, the third insulating layer 13 may be a single polyimide resin layer. However, embodiments of the present inventive concepts are not limited thereto, and the third insulating layer 13 may include at least one of acrylic resin, methacrylic resin, polyisoprene, vinyl resin, epoxy resin, urethane resin, cellulose resin, siloxane-based resin, polyimide-based resin, polyamide-based resin, and perylene resin. The organic layer to be described later may include at least one of the above materials.

The first connection electrode 312-C1 and the second connection electrode 312-C2 may be disposed on the third insulating layer 13. Each of the first connection electrode 312-C1 and the second connection electrode 312-C2 may be electrically connected to the transistor 312-T by passing through the first to third insulating layers 11, 12, and 13.

The fourth insulating layer 14 may be disposed on the third insulating layer 13 and may cover the first connection electrode 312-C1 and the second connection electrode 312-C2. In an embodiment, the fourth insulating layer 14 may be an inorganic layer.

The fifth insulating layer 15 may be disposed on the fourth insulating layer 14. In an embodiment, the fifth insulating layer 15 may be an organic layer and may have a single layer or a multilayer structure.

The light emitting element layer 313 may be disposed on the fifth insulating layer 15. The light emitting element layer 313 may include a first electrode 313-E1, a light emitting layer 313-EL, and a second electrode 313-E2. As shown in the embodiment of FIG. 5, a lower surface of the light emitting layer 313-EL may be disposed on an upper surface of the first electrode 313-E1 and a lower surface of the second electrode 313-E2 may be disposed on an upper surface of the light emitting layer 313-EL.

The first electrode 313-E1 may be electrically connected to the transistor 312-T by passing through the fourth insulating layer 14 and the fifth insulating layer 15 and extending to the second connection electrode 312-C2. The first electrode 313-E1 may overlap (e.g., in the third direction DR3) Y or more transmission portions 431 of an optical pattern layer 430 (see FIG. 6). Y may be a positive integer, and the description of the transmission portions 431 of the optical pattern layer 430 (see FIG. 6) will be described later.

The pixel defining layer 16 may be disposed on the fifth insulating layer 15 and on lateral edges of the first electrode 313-E1. An opening for exposing the first electrodes 313-E1 (e.g., a central portion of the first electrodes 313-E1) may be defined in the pixel defining layer 16. The shape of the opening on a plane may correspond to the pixel area PXA.

The light emitting layer 313-EL may be disposed on the first electrode 313-E1. The light emitting layer 313-EL may provide light of a predetermined color. The embodiment of FIG. 5 shows a light emitting layer 313-EL having a patterned single layer. However, embodiments of the present inventive concepts are not limited thereto. For example, in other embodiments, the light emitting layer 313-EL may have a multilayer structure. In addition, the light emitting layer 313-EL may extend toward the upper surface of the pixel defining layer 16.

The second electrode 313-E2 may be disposed on the light emitting layer 313-EL. In an embodiment, an electron control layer may be disposed between the second electrode 313-E2 and the light emitting layer 313-EL, and a hole control layer may be disposed between the first electrode 313-E1 and the light emitting layer 313-EL.

In an embodiment of the present inventive concepts, each of the first electrode 313-E1 and the second electrode 313-E2 may include a transparent conductive material. For example, each of the first electrode 313-E1 and the second electrode 313-E2 may include at least one compound selected from indium tin oxide (ITO), indium zinc oxide (IZO), indium gallium oxide (IGO), and indium gallium zinc oxide (IGZO). However, embodiments of the present inventive concepts are not limited thereto.

The encapsulation layer 314 may be disposed on the second electrode 313-E2. As shown in the embodiment of FIG. 5, the encapsulation layer 314 may include a first inorganic layer 314-1, an organic layer 314-2, and a second inorganic layer 314-3.

The first inorganic layer 314-1 may be disposed on the second electrode 313-E2 (e.g., in the third direction DR3). The organic layer 314-2 may be disposed on the first inorganic layer 314-1 (e.g., in the third direction DR3). The second inorganic layer 314-3 may be disposed on the organic layer 314-2 and may cover the organic layer 314-2 (e.g., in the third direction DR3). In an embodiment, the first inorganic layer 314-1 and the second inorganic layer 314-3 may include a silicon nitride layer, a silicon oxy nitride layer, a silicon oxide layer, a titanium oxide layer, an aluminum oxide layer, or the like. However, embodiments of the present inventive concepts are not limited thereto. In an embodiment, the organic layer 314-2 may include an acryl-based organic layer. However, embodiments of the present inventive concepts are not limited thereto. The first inorganic layer 314-1 and the second inorganic layer 314-3 may protect the light emitting element layer 313 from moisture/oxygen, and the organic layer 314-2 may protect the light emitting element layer 313 from foreign substances such as dust particles.

The input detection layer 320 may be disposed on the encapsulation layer 314 (e.g., in the third direction DR3). The input detection layer 320 may include a first conductive layer 321-M, a first detection insulating layer 321, a second conductive layer 322-M, and a second detection insulating layer 322. At least one of the first conductive layer 321-M and the second conductive layer 322-M may include detection electrodes. The input detection layer 320 may obtain information on an external input through a change in capacitance between the detection electrodes.

Figure 6:
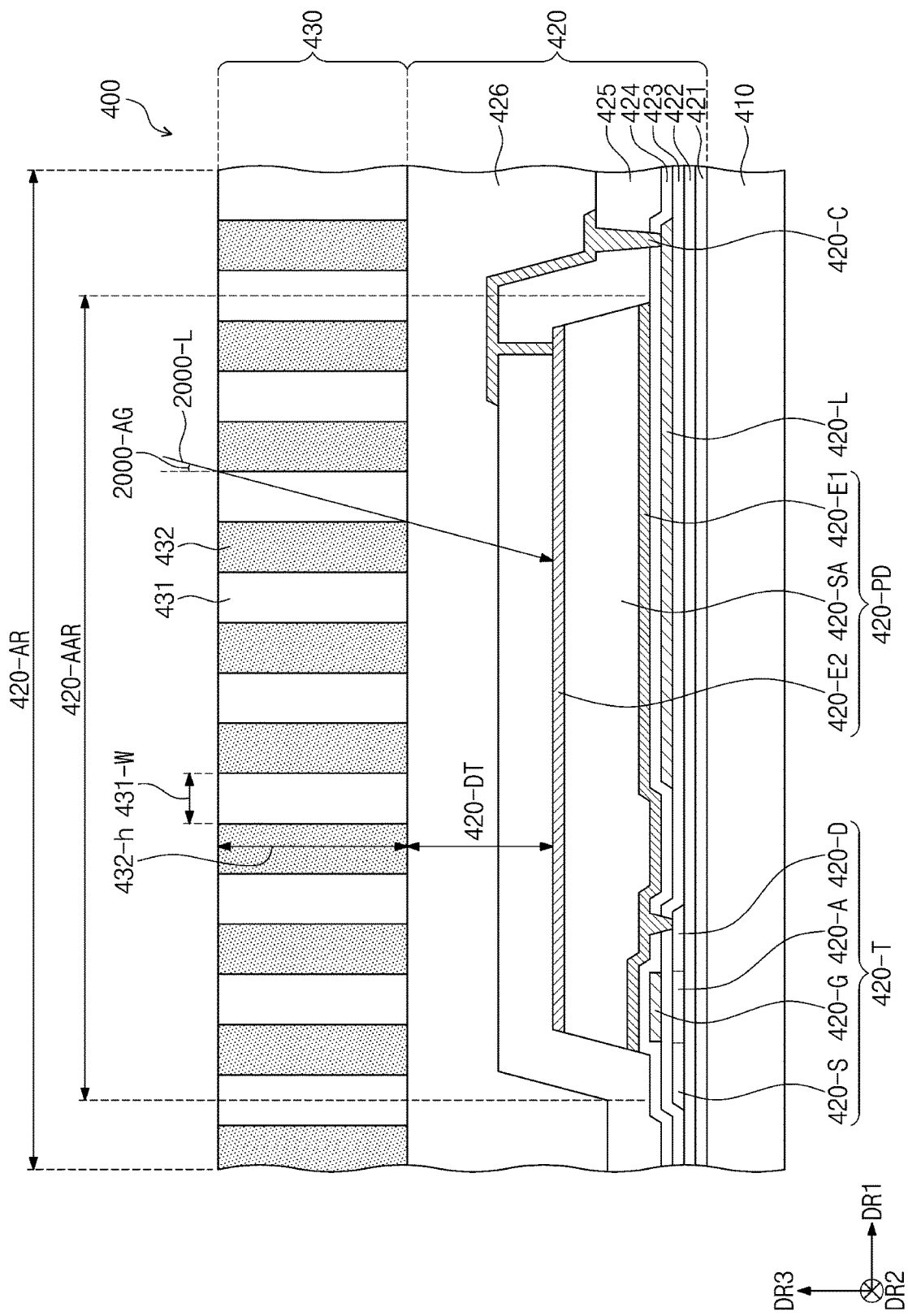
FIG. 6 is a cross-sectional view of a detection unit according to an embodiment of the present inventive concepts.

FIG. 6 is a cross-sectional view of a detection unit according to an embodiment of the present inventive concepts.

Referring to FIG. 6, the detection unit 400 may include a base layer 410, a sensor 420 disposed on the base layer 410, and an optical pattern layer 430 disposed on the sensor 420.

The barrier layer 421 may be disposed on the base layer 410 (e.g., in the third direction DR3). The buffer layer 422 may be disposed on the barrier layer 421 (e.g., in the third direction DR3). The description of the barrier layer 421 and the buffer layer 422 may correspond to the barrier layer 10 and the buffer layer 20 described above with reference to FIG. 5.

The transistor 420-T may be disposed on the buffer layer 422. The transistor 420-T may include an active pattern 420-A, a source 420-S, a drain 420-D, and a gate 420-G. The active pattern 420-A, the source 420-S, and the drain 420-D may be disposed on the buffer layer 422.

The first insulating layer 423 is disposed on the buffer layer 422 and covers the active pattern 420-A, the source 420-S, and the drain 420-D. In an embodiment, the first insulating layer 423 may be an inorganic layer and/or an organic layer and may have a single layer or multilayer structure. For example, in an embodiment, the first insulating layer 423 may be a single silicon oxide layer.

The gate 420-G and the wiring layer 420-L may be disposed on the first insulating layer 423 (e.g., in the third direction DR3). The wiring layer 420-L may be provided with a predetermined voltage, for example, a bias voltage. The wiring layer 420-L may be electrically connected to the detection element 420-PD which will be described later.

The second insulating layer 424 may be disposed on the first insulating layer 423 and may cover the gate 420-G and the wiring layer 420-L (e.g., in the third direction DR3). In an embodiment, the second insulating layer 424 may be an inorganic layer and may have a single layer or a multilayer structure. For example, the second insulating layer 424 may be a single silicon oxide layer.

The detection element 420-PD may be disposed on the second insulating layer 424. The detection element 420-PD may be electrically connected to the transistor 420-T and the wiring layer 420-L. For example, the detection element 420-PD may be controlled by a signal provided from the transistor 420-T, and may receive a predetermined voltage from the wiring layer 420-L.

The detection element 420-PD may include a first detection electrode 420-E1, a detection layer 420-SA, and a second detection electrode 420-E2.

The first detection electrode 420-E1 may pass through the first and second insulating layers 423 and 424 to be electrically connected to the transistor 420-T. The first detection electrode 420-E1 may include an opaque conductive material. For example, the first detection electrode 420-E1 may include molybdenum (Mo).

The detection layer 420-SA may be disposed on the first detection electrode 420-E1. In an embodiment, the detection layer 420-SA may include amorphous silicon.

The second detection electrode 420-E2 may be disposed on the detection layer 420-SA (e.g., in the third direction DR3). In an embodiment, the second detection electrode 420-E2 may include a transparent conductive material. For example, the second detection electrode 420-E2 may include indium tin oxide (ITO).

The third insulating layer 425 may be disposed on the second detection electrode 420-E2 (e.g., in the third direction DR3). In an embodiment, the third insulating layer 425 may be an inorganic layer and may have a single layer or a multilayer structure. For example, the third insulating layer 425 may include a silicon oxide layer and a silicon nitride layer.

The connection electrode 420-C may be disposed on the third insulating layer 425 (e.g., in the third direction DR3). The connection electrode 420-C may be electrically connected to the second detection electrode 420-E2 through the third insulating layer 425. In addition, the connection electrode 420-C may be electrically connected to the wiring layer 420-L through the second and third insulating layers 424 and 425.

The fourth insulating layer 426 may be disposed on the third insulating layer 425 (e.g., in the third direction DR3) and cover the connection electrode 420-C. In an embodiment, the fourth insulating layer 426 may be an organic layer and may have a single layer or a multilayer structure. For example, the fourth insulating layer 426 may be a single polyimide resin layer.

The optical pattern layer 430 may be disposed directly on the sensor 420. For example, a lower surface of the optical pattern layer 430 may be disposed directly on an upper surface of the fourth insulating layer 426 (e.g., in the third direction DR3). For example, in an embodiment, the optical pattern layer 430 and the sensor 420 may be formed through a continuous process.

The optical pattern layer 430 may include a plurality of transmission portions 431 (hereinafter, referred to as transmission portions) and at least one light blocking portion 432. For example, the light blocking portion 432 may be a single light blocking portion that surrounds a plurality of discrete transmission portions 431 or the light blocking portion 432 may be a plurality of discrete light blocking portions alternatingly arranged with the transmission portions 431. The transmission portions 431 may have optical transparency, and the light blocking portions 432 may have a property of absorbing light. Light 2000-L reflected from the fingerprint 200 (see FIG. 1) may pass through the transmission portions 431 and may be incident on the detection element 420-PD.

When the incident angle 2000-AG of the light 2000-L on the optical pattern layer 430 (e.g., an upper surface of the optical pattern layer 430) is larger than a predetermined maximum angle, in addition to light reflected from a first valley of the fingerprint 2000 (see FIG. 1) corresponding to the detection element 420-PD, light reflected from a second valley adjacent to the first valley may be incident on the detection element 420-PD. This may reduce the accuracy of fingerprint recognition. According to an embodiment of the present inventive concepts, the optical pattern layer 430 may prevent light 2000-L having a certain incident angle 2000-AG from passing through the optical pattern layer 430. For example, only light 2000-L incident at an angle that is less than or equal to a predetermined maximum incidence angle may pass through the optical pattern layer 430 to the detection element 420-PD. Therefore, the accuracy or sensitivity of fingerprint recognition may be improved.

In an embodiment of the present inventive concepts, the maximum incidence angle may be determined based on the half value of the pitch of the fingerprint 2000 (see FIG. 1) and the separation distance (e.g., in the third direction DR3) between the outermost surface of the display device 1000 (see FIG. 1) and the optical pattern layer 430. For example, the pitch of the fingerprint 2000 may be defined as a gap between a first valley and a second valley or the gap between a first ridge and a second ridge. The pitch of the fingerprint 2000 may generally range from 400 micrometers to 600 micrometers. The separation distance may be a distance between the upper surface of the optical pattern layer 430 and the upper surface of the window 100 (see FIG. 2).

For example, in an embodiment in which the pitch of the fingerprint 2000 is 400 micrometers and the separation distance is 800 micrometers, the maximum incidence angle may be defined as $\tan^{-1}(200/800)$, which is equal to 14 degrees. In an embodiment in which the pitch of the fingerprint 2000 is 600 micrometers and the separation distance is 800 micrometers, the maximum incidence angle 2000-AG may be defined as $\tan^{-1}(300/800)$, which is equal to 20 degrees. A predetermined incidence angle may be set as a design condition in consideration of the pitch of the fingerprint 2000 and the separation distance.

The incidence angle 2000-AG may be controlled by the ratio of the width 431-W (e.g., length in the first direction DR1) of each of the transmission portions 431 and the height 432-h (e.g., length in the third direction DR3) of the light blocking portions 432. For example, if the maximum incidence angle of light passing through the optical pattern layer 430 is 15 degrees, the ratio of the width 431-W of each of the transmission portions 431 and the height 432-h of the light blocking portion 432 may be set to satisfy the following equation.

$$\text{width}(431\text{-}W)/\text{height}(432\text{-}h) \leq \tan(15 \text{ degrees}) \quad \text{[Equation]}$$

Therefore, width(431-W)/height(432-h) may be 0.2679 or less. For example, the ratio of the width 431-W of the transmission portions 431 and the height 432-h of the light blocking portions 432 may be (1:3.73 or more). For example, the height 432-h may be 1/tan(AG) times or more of the width 431-W. The AG may be an incidence angle set according to design conditions. If the height 432-h is 1/tan(AG) times of the width 431-W, the incidence angle (e.g., in consideration of the pitch of the fingerprint 2000 and the separation distance) may correspond to a maximum incidence angle of light that may pass through the optical pattern layer 430.

The height 432-h may be set to 3.73 times or more the width 431-W. For example, the ratio of the width 431-W and the height 432-h may be set to 1:3.75. For example, when the width 431-W is 2 micrometers, the height 432-h may be greater than or equal to 7.5 micrometers.

The upper limit of the ratio of the width 431-W of the transmission portions 431 and the height 432-h of the light blocking portions 432 may be determined in consideration of the transmittance. For example, as the ratio of the width 431-W of the transmission portions 431 and the height 432-h of the light blocking portions 432 increases, the amount of light that may pass through the transmission portions 431 may decrease. Accordingly, in consideration of this, the ratio of the width 431-W of the transmission portions 431 and the height 432-h of the light blocking portions 432 may be predetermined, and for example, the ratio of the width 431-W and the height 432-h may be 1:(5 or less). However, the upper limit of the ratio of the width 431-W and the height 432-h is not limited to the above example.

According to an embodiment of the present inventive concepts, one detection element 420-PD may overlap the plurality of transmission portions 431 (e.g., in the third direction DR3). In an embodiment, the pitch between the detection element 420-PD and a second detection element adjacent to the detection element 420-PD may be 50 micrometers, and the gap between adjacent detection elements 420-PD may be 7.5 micrometers. Therefore, the width of the second detection electrodes 420-E2 may be about 42.5 micrometers. In this embodiment, a plurality of transmission portions 431 having a width 431-W of 2 micrometers may be disposed on the second detection electrodes 420-E2. For example, one second detection electrode 420-E2 may overlap at least X transmission portions 431. X may be a positive integer.

In an embodiment of the present inventive concepts, the size of the second detection electrode 420-E2 may be larger than the size of the first electrode 313-E1 (see FIG. 5). For example, the width of the second detection electrode 420-E2 (e.g., length in the first direction DR1) may be larger than the width of the first electrode 313-E1. Accordingly, the number of transmission portions 431 overlapping the second detection electrodes 420-E2 (e.g., in the third direction DR3) may be greater than the number of transmission portions 431 overlapping the first electrodes 313-E1.

In an embodiment of the present inventive concepts, the minimum distance 420-DT (e.g., length in the third direction DR3) between the light blocking portion 432 and the detection element 420-PD may be less than or equal to 5 micrometers and greater than or equal to 1 micrometer. For example, the minimum distance 420-DT may be in a range of about 1 micrometer-5 micrometers. The minimum distance 420-DT may be a distance (e.g., length in the third direction DR3) between the lowermost surface of the light blocking portion 432 and the uppermost part of the detection element 420-PD, such as a top surface of the second detection electrode 420-E2 of the detection element 420-PD. However, the lower limit of the minimum distance 420-DT is not limited to the above example.

If the minimum distance 420-DT exceeds 5 micrometers, interference may occur between the lights passing through the optical pattern layer 430, and this may lower the fingerprint sensing sensitivity. For example, in an embodiment, the minimum distance 420-DT may be determined to be about 2.5 micrometers or more and about 2.8 micrometers or less. However, the minimum distance 420-DT is not limited to the above numerical value.

According to an embodiment of the present inventive concepts, since the optical pattern layer 430 is disposed directly on the sensor 420, the distance (e.g., length in the third direction DR3) between the optical pattern layer 430 and the second detection electrodes 420-E2 may be reduced. As a result, the occurrence of interference between lights passing through the optical pattern layer 430 may be prevented or reduced, so that the accuracy of fingerprint recognition may be improved.

Hereinafter, a method of forming the optical pattern layer 430 will be described.

In an embodiment of the present inventive concepts, a transmission layer including the same material as the material of the transmission portions 431 is formed directly on the sensor 420. The transmission layer may be patterned to form transmission portions 431. An opaque material may be filled between the transmission portions 431 to form the light blocking portions 432. In an embodiment, a photoresist process or a nanoimprint process may be used to pattern the transmission layer. In addition, a hard mask including an inorganic material may be used to pattern the transmission layer, and a dry etching process may be used. In addition, a chemical mechanical polishing process may be used after filling the opaque material.

In another embodiment of the present inventive concepts, a light blocking layer including the same material as the material of the light blocking portion 432 is formed directly on the sensor 420. The light blocking layer is patterned to form the light blocking portion 432. Thereafter, a transparent material may be filled in the light blocking portion 432 to form the transmission portions 431.

Figure 7:
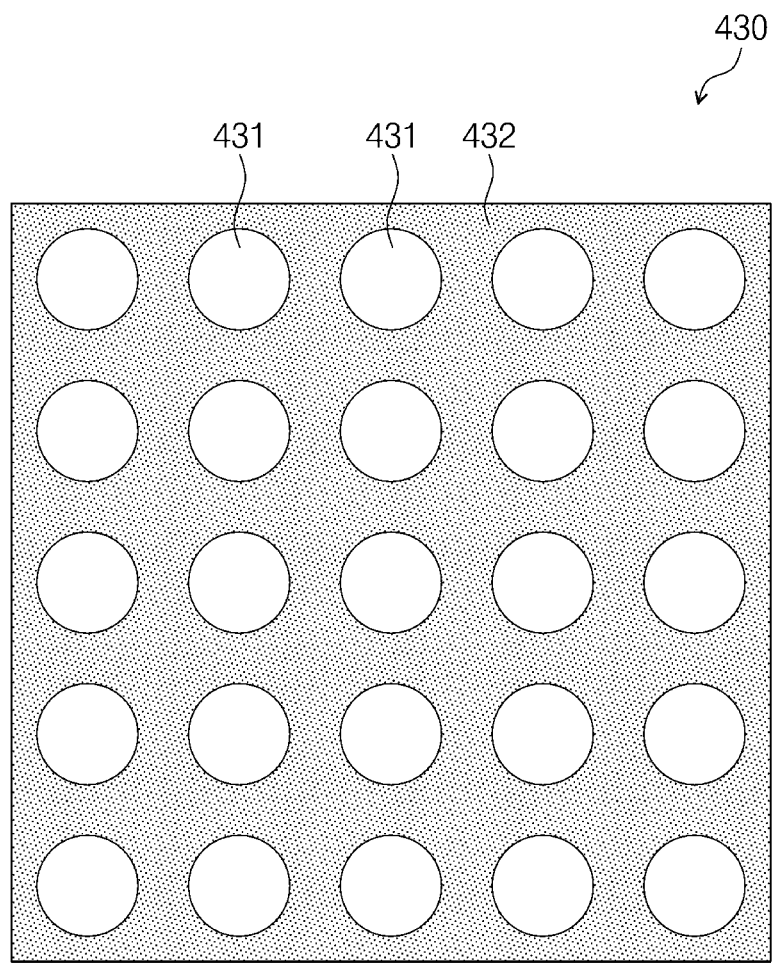
FIG. 7 is a plan view of an optical pattern layer according to an embodiment of the present inventive concepts.

FIG. 7 is a plan view of an optical pattern layer according to an embodiment of the present inventive concepts.

Referring to FIG. 7, the optical pattern layer 430 may include transmission portions 431 and a light blocking portion 432 surrounding the transmission portions 431 (e.g., in the first direction DR1 and the second direction DR2).

As shown in the embodiment of FIG. 7, when viewed on a plane (e.g., from the third direction DR3), each of the transmission portions 431 may have a circular shape. However, embodiments of the present inventive concepts are not limited thereto and the shape of the transmission portions 431 may be modified into various shapes such as an ellipse, a polygon, etc. Each of the transmission portions 431 may be arranged along the first direction DR1 and the second direction DR2. For example, the transmission portions 431 may be arranged in a matrix form. In an embodiment, each of the transmission portions 431 may be equally spaced apart from each other in a series of evenly spaced rows (e.g., extending in the first direction DR1) and columns (e.g., extending in the second direction DR2). However, embodiments of the present inventive concepts are not limited thereto.

Figure 8:
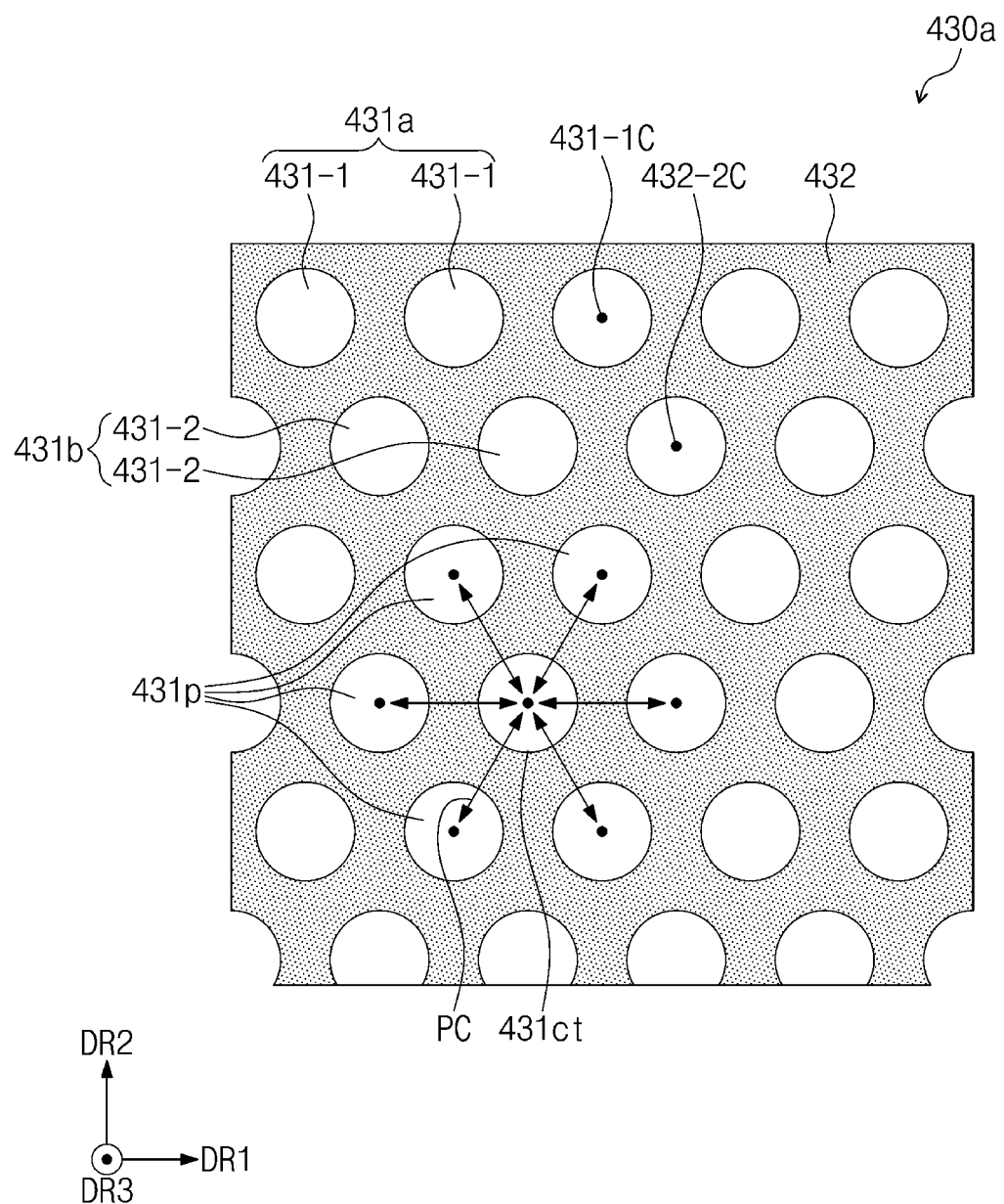
FIG. 8 is a plan view of an optical pattern layer according to an embodiment of the present inventive concepts.

FIG. 8 is a plan view of an optical pattern layer according to an embodiment of the present inventive concepts.

Referring to FIG. 8, the optical pattern layer 430a may include transmission portions 431-1 and 431-2 and a light blocking portion 432 surrounding the transmission portions 431-1 and 431-2 (e.g., in the first direction DR1 and second direction DR2).

The transmission portions 431-1 and 431-2 may include first transmission portions 431-1 constituting a first transmission arrangement 431a and second transmission portions 431-2 constituting a second transmission arrangement 431b. The first transmission portions 431-1 may be arranged along the first direction DR1, and the second transmission portions 431-2 may be arranged along the first direction DR1.

The first transmission arrangement 431a and the second transmission arrangement 431b may be alternately arranged along the second direction DR2. For example, the first transmission arrangement 431a and the second transmission arrangement 431b may be a series of columns offset from each other (e.g., in the first direction DR1). The center 431-4C of the first transmission portions 431-1 may not overlap the center 432-2C of the second transmission portions 431-2 in the second direction DR2. For example, the first transmission portions 431-1 and the second transmission portions 431-2 may be offset from each other in the first direction DR1 and may be arranged in a zigzag along the second direction DR2.

When defining one of the transmission portions 431-1 and 431-2 as the central transmission portion 431ct, six peripheral transmission portions 431p spaced at the same pitch PC (e.g., distance in the first direction DR1 and/or a direction between the first direction DR1 and the second direction DR2) from the central transmission portion 431ct may be defined. The six peripheral transmission portions 431p may be immediately adjacent to the central transmission portion 431ct in the first direction DR1 and/or a direction between the first direction DR1 and the second direction DR2.

In comparison with the embodiment of FIG. 7, the optical pattern layer 430a of the embodiment of FIG. 8 includes an increased number of transmission portions 431-1 and 431-2 in the same area. Therefore, the transmittance of the optical pattern layer 430a may be further improved. As a result, the amount of light reaching the sensor 420 (see FIG. 6) is increased, so that fingerprint detection may be more efficient and precise.

Figure 9:
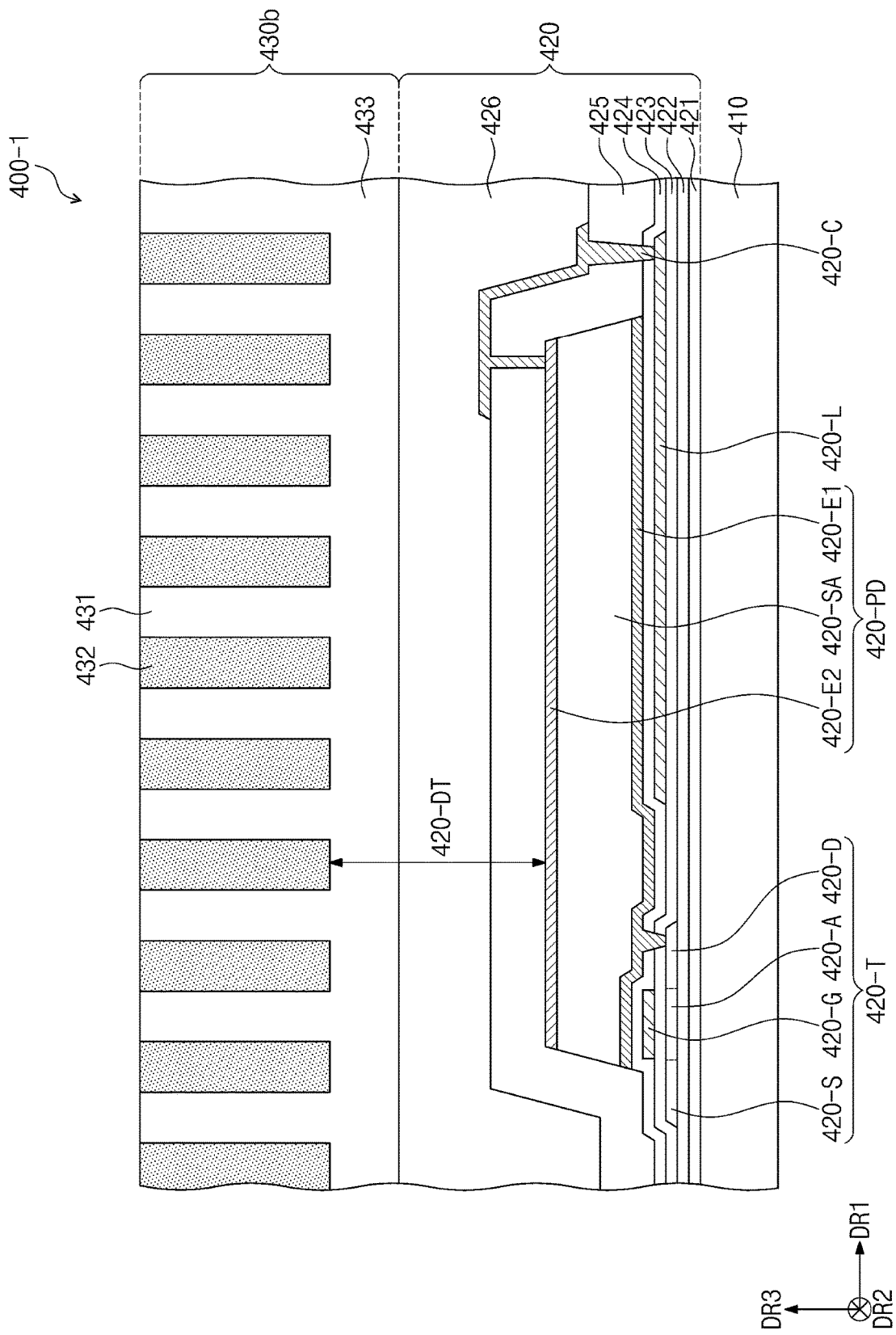
FIG. 9 is a cross-sectional view of a detection unit according to an embodiment of the present inventive concepts.

FIG. 9 is a cross-sectional view of a detection unit 400-1 according to an embodiment of the present inventive concepts. In the description of FIG. 9, the same reference numerals are given to the same components as those described with reference to FIG. 6, and a description thereof will be omitted.

Referring to FIG. 9, the optical pattern layer 430b may include transmission portions 431, a light blocking portion 432, and a transmission layer 433. The transmission layer 433 may be disposed between the transmission portions 431 and the sensor 420 (e.g., in the third direction DR3) and between the light blocking portions 432 and the sensor 420 (e.g., in the third direction DR3). In an embodiment, the transmission layer 433 may include the same material as the transmission portions 431, and the transmission layer 433 and the transmission portions 431 may have an integral shape.

In an embodiment of the present inventive concepts, after forming a preliminary transmission layer including the same material as the material of the transmission portions 431, an upper portion of the preliminary transmission layer (e.g., in the third direction DR3) may be patterned to form transmission portions 431 and a transmission layer 433. Thereafter, the light blocking portion 432 may be formed by filling an opaque material between the transmission portions 431.

The minimum distance 420-DT between the light blocking portion 432 and the second detection electrode 420-E2 may be less than or equal to 5 micrometers and greater than or equal to 1 micrometer. For example, in an embodiment, the minimum distance 420-DT may be in a range of about 2.5 micrometers to about 2.8 micrometers. According to an embodiment of the present inventive concepts, since the optical pattern layer 430b is disposed directly on the sensor 420, the distance (e.g., length in the third direction DR3) between the optical pattern layer 430b and the second detection electrodes 420-E2 may be reduced. Therefore, interference between lights passing through the optical pattern layer 430b may be prevented.

Figure 10:
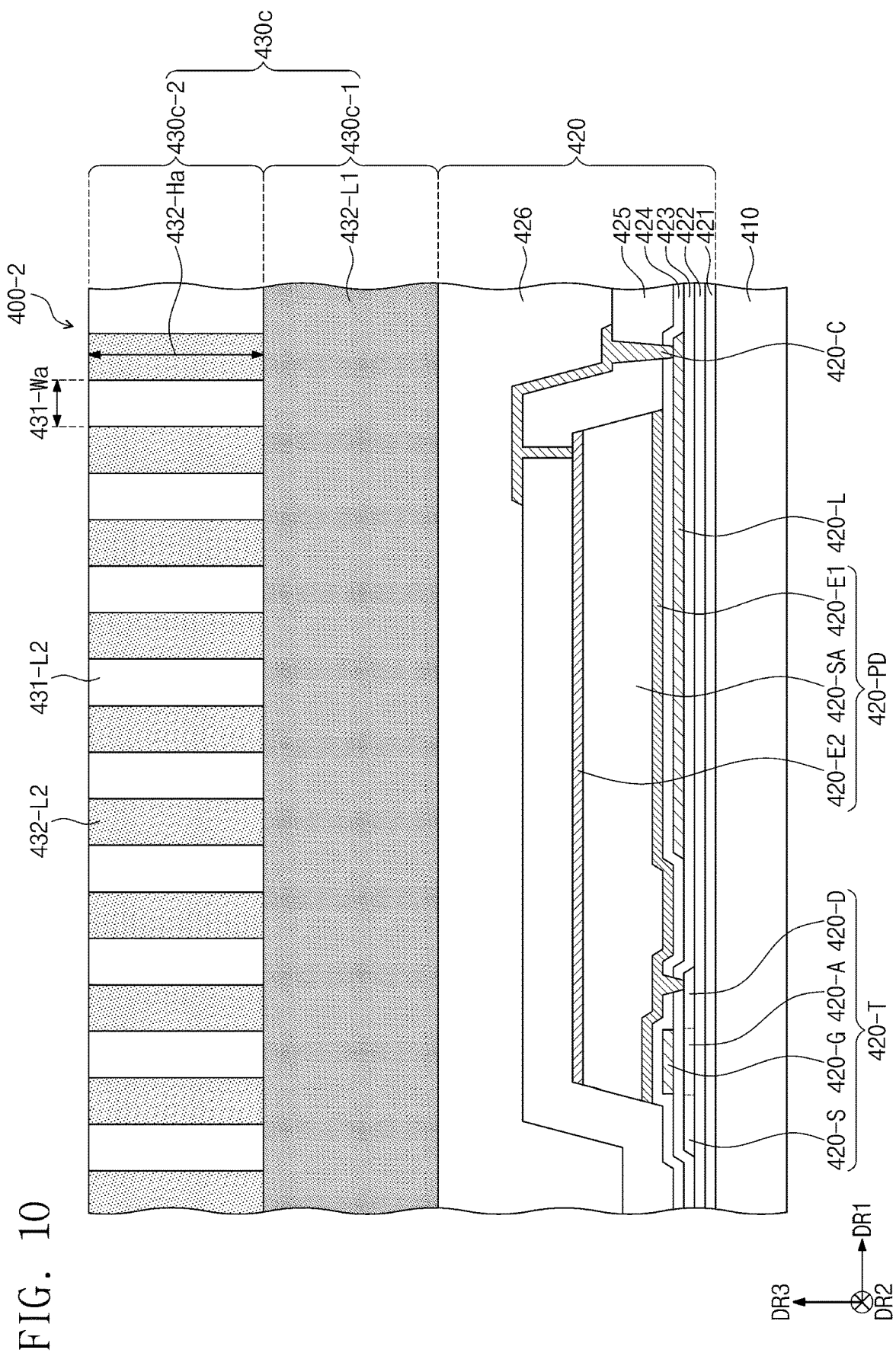
FIG. 10 is a cross-sectional view of a detection unit according to an embodiment of the present inventive concepts.
Figure 11:
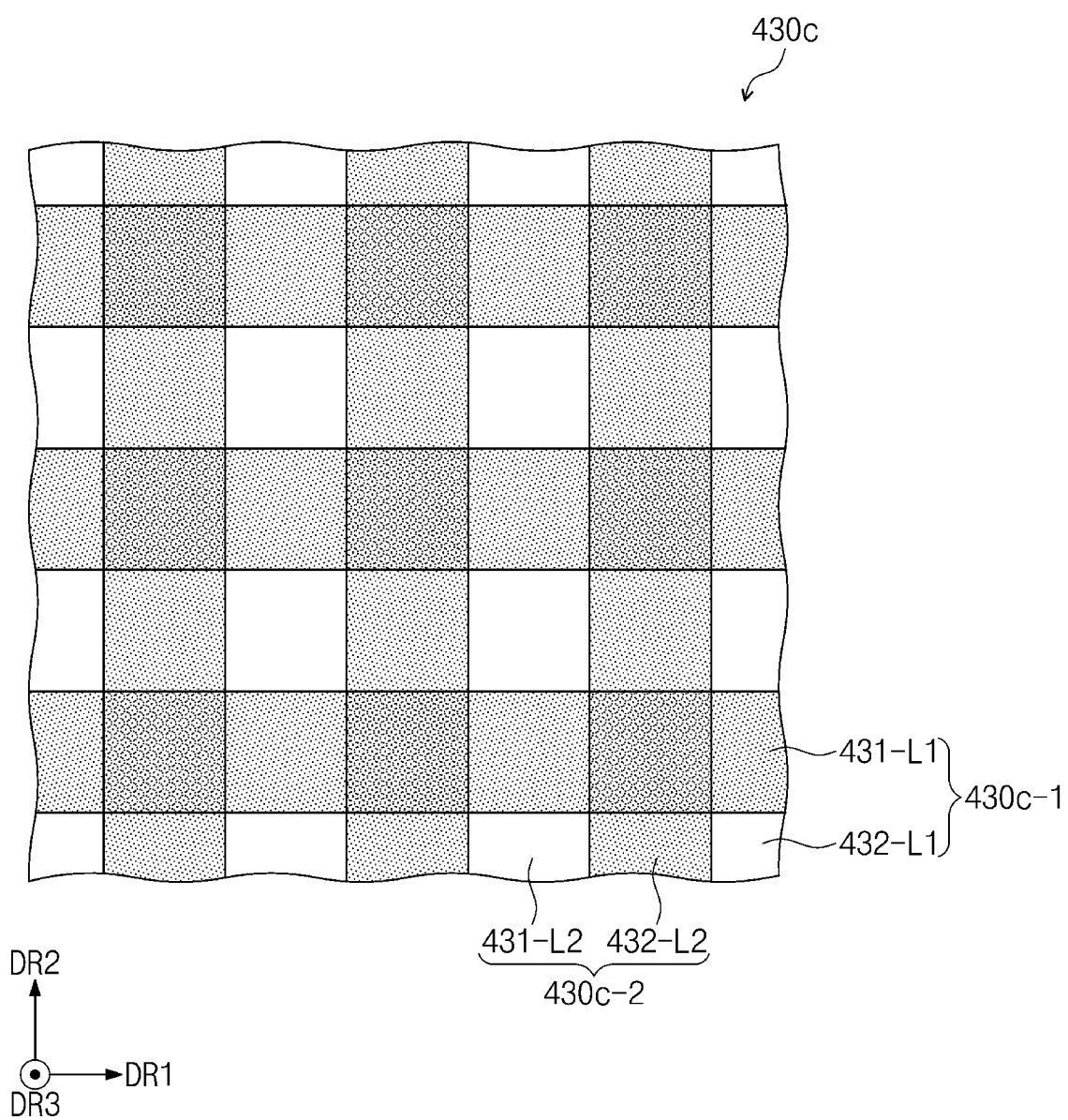
FIG. 11 is a plan view of an optical pattern layer and an additional optical pattern layer according to an embodiment of the present inventive concepts.

FIG. 10 is a cross-sectional view of a detection unit 400-2 according to an embodiment of the present inventive concepts. FIG. 11 is a plan view of an optical pattern part according to an embodiment of the present inventive concepts. In the description of FIG. 10, the same reference numerals are given to the same components as those described with reference to FIG. 6, and a description thereof will be omitted.

Referring to FIGS. 10 and 11, the optical pattern part 430c may be directly disposed on the sensor 420 (e.g., in the third direction DR3). The optical pattern part 430c may include two optical pattern layers 430c-1 and 430c-2. For example, optical pattern layer 430c-1 may be disposed directly on the sensor 420, and an additional optical pattern layer 430c-2 may be disposed directly on the optical pattern layer 430c-1 (e.g., in the third direction DR3).

The optical pattern layer 430c-1 may include transmission portions 431-L1 and light blocking portions 432-L1. The additional optical pattern layer 430c-2 may include additional transmission portions 431-L2 and additional light blocking portions 432-12.

In an embodiment, each of the transmission portions 431-L1 and the light blocking portions 432-L1 of the optical pattern layer 430c-1 may extend along the first direction DR1. The transmission portions 431-L1 and the light blocking portions 432-L1 may be alternately arranged along the second direction DR2. Each of the additional transmission portions 431-12 and the additional light blocking portions 432-L2 may extend along the second direction DR2. The additional transmission portions 431-L2 and the additional light blocking portions 432-L2 may be alternately arranged along the first direction DR1. When viewed on a plane (e.g., in the third direction DR3), the optical pattern layer 430c-1 and the additional optical pattern layer 430c-2 may have a lattice shape. However, embodiments of the present inventive concepts are not limited thereto. For example, in other embodiments, the transmission portions 431-L1 and the light blocking portions 432-L1 of the optical pattern layer 430c-1 may extend along the second direction DR2 and may be alternately arranged along the first direction DR1 and the additional transmission portions 431-L2 and the additional light blocking portions 432-L2 of the additional optical pattern layer 430c-2 may extend in the first direction DR1 and be alternatively arranged along the second direction DR2.

In an embodiment, the ratio of the width 431-Wa of each of the additional transmission portions 431-L2 and the height 432-Ha of the additional light blocking portions 432-L2 may be less than or equal to 1:3.73. For example, the ratio of the width 431-Wa and the height 432-Ha may be set to 1:3.75. In an embodiment in which the width 431-Wa is 2 micrometers, the height 432-Ha may be 7.5 micrometers. The ratio of the transmission portions 431-L1 and the light blocking portions 432-L1 may be set to be equal to the ratio of the additional transmission portions 431-L2 and the additional light blocking portions 432-L2.

Figure 12:
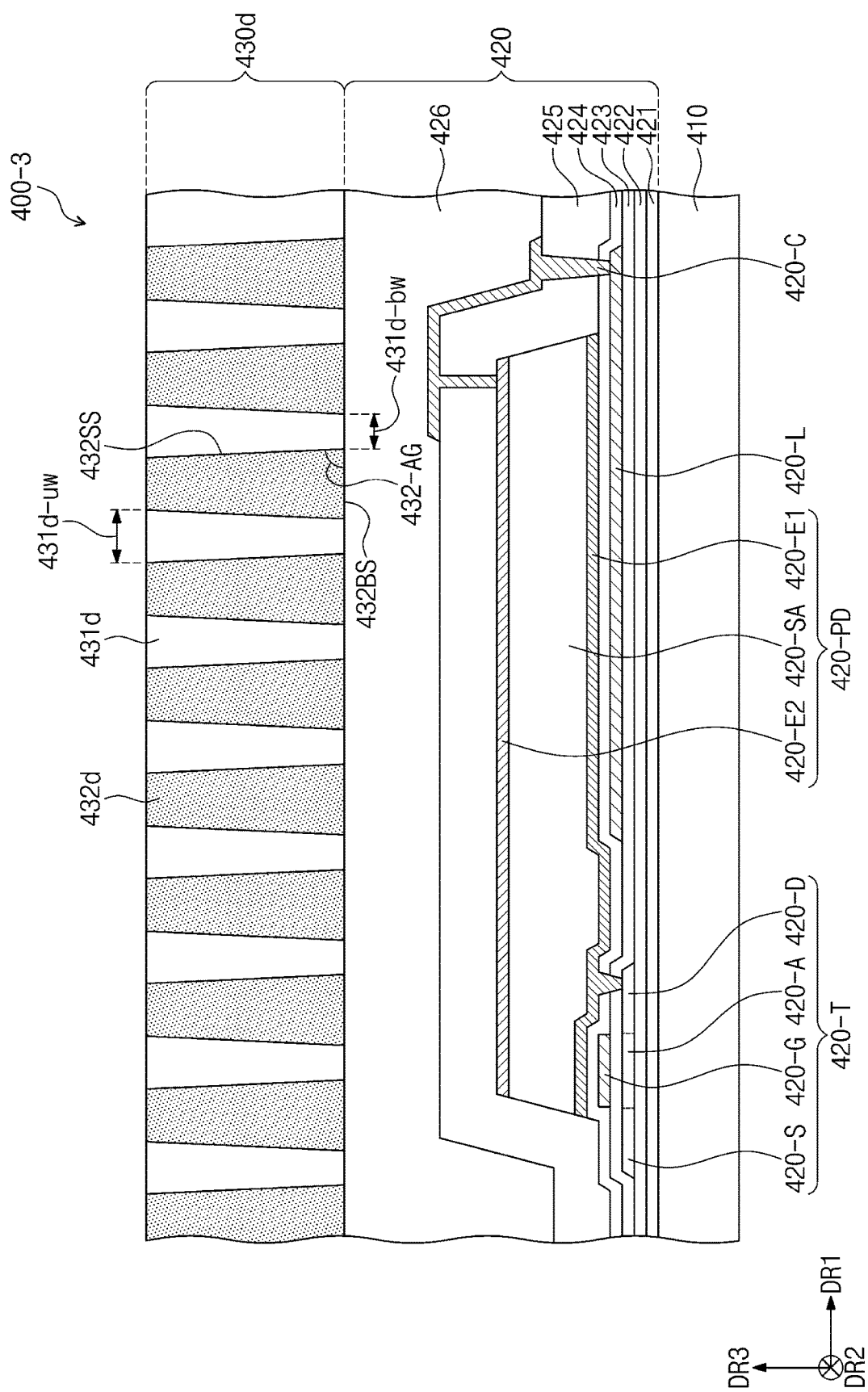
FIG. 12 is a cross-sectional view of a detection unit according to an embodiment of the present inventive concepts.
Figure 13:
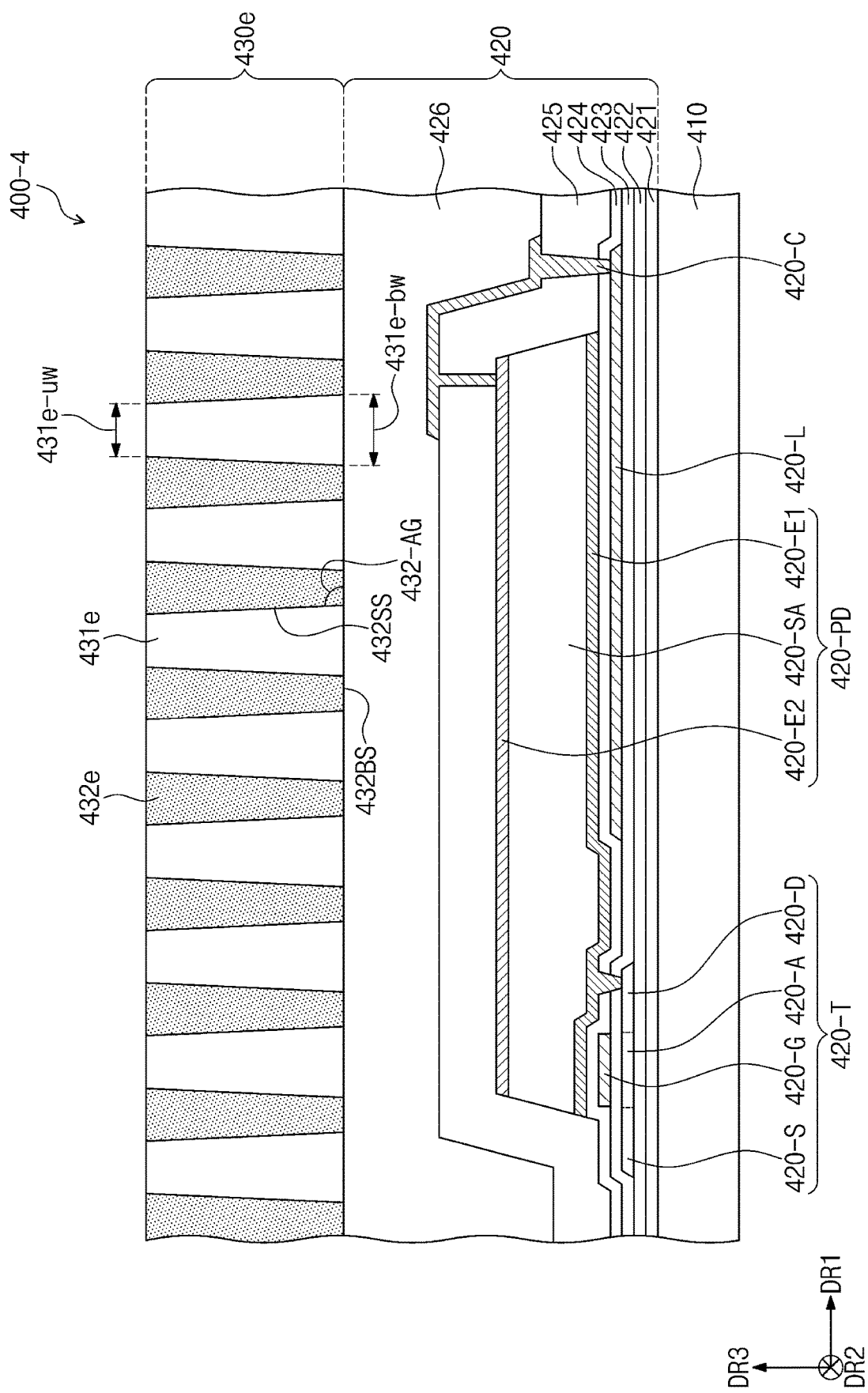
FIG. 13 is a cross-sectional view of a detection unit according to an embodiment of the present inventive concepts.

FIG. 12 is a cross-sectional view of a detection unit 400-3 according to an embodiment of the present inventive concepts. FIG. 13 is a cross-sectional view of a detection unit 400-4 according to an embodiment of the present inventive concepts. In the description of FIGS. 12 and 13, the same reference numerals are given to the same components as those described with reference to FIG. 6, and a description thereof will be omitted.

Referring to FIG. 12, the optical pattern layer 430d may include transmission portions 431d and a light blocking portion 432d. The light blocking portions 432d may include a bottom surface 432BS facing the sensor 420 and a side surface 432SS contacting the transmission portions 431d. As shown in the embodiment of FIG. 12, the angle 432-AG between the bottom surface 432BS and the side surface 432SS of the light blocking portion 432d may be less than 90 degrees. For example, in an embodiment, the angle 432-AG may be in a range of about 85 degrees –90 degrees. However, embodiments of the present inventive concepts are not limited thereto.

Hereinafter, an embodiment in which the angle 432-AG is smaller than 90 degrees will be described by way of example. In this embodiment, each of the transmission portions 431d may have a different width (e.g., length in the first direction DR1) depending on the position in the third direction DR3. An upper surface of each of the transmission portions 431d may have a first width 431d-uw, and each lower surface of the transmission portions 431d may have a second width 431d-bw. The first width 431d-uw may correspond to the maximum width of each of the transmission portions 431d, and the second width 431d-bw may correspond to the minimum width of each of the transmission portions 431d.

The first width 431d-uw may be equal to the width 431-W shown in FIG. 6. In addition, the second width 431d-bw may be smaller than the width 431-W (see FIG. 6). In this embodiment, the maximum incidence angle of light that may pass through the optical pattern layer 430d may be smaller than the maximum incidence angle of light that may pass through the optical pattern layer 430 of FIG. 6. Therefore, according to the embodiment of FIG. 12, the accuracy or sensitivity of fingerprint recognition may be further improved.

Referring to FIG. 13, the optical pattern layer 430e may include transmission portions 431e and a light blocking portion 432e. In the embodiment shown in FIG. 13, the angle 432-AG between the bottom surface 432BS of the light blocking portion 432e and the side surface 432SS of the light blocking portion 432e may be greater than 90 degrees. For example, the angle 432-AG may be in a range of about 90 degrees –95 degrees.

Hereinafter, an embodiment in which the angle 432-AG is larger than 90 degrees will be described by way of example. In this embodiment, each of the transmission portions 431e may have a different width (e.g., length in the first direction DR1) depending on the position in the third direction DR3. An upper surface of each of the transmission portions 431e may have a first width 431e-uw, and each lower surface of the transmission portions 431e may have a second width 431e-bw. The first width 431e-uw may correspond to the minimum width of each of the transmission portions 431e, and the second width 431e-bw may correspond to the maximum width of each of the transmission portions 431e.

In an embodiment, the first width 431e-uw may be equal to the width 431-W shown in FIG. 6 and the first width 431d-uw shown in FIG. 12. The second width 431e-bw may be greater than the width 431-W (see FIG. 6). In this embodiment, the transmittance of light passing through the optical pattern layer 430e may be improved.

As the angle 432-AG between the bottom surface 432BS and the side surface 432SS becomes smaller with the first widths 431d-uw and 431e-uw fixed, the transmittance of light passing through the optical pattern layers 430d and 430e may be reduced. However, the maximum incidence angle of the light passing through the optical pattern layers 430d and 430e is also reduced so that the accuracy of fingerprint recognition may be improved. Additionally, as the angle 432-AG is increased, the maximum incidence angle of the light passing through the optical pattern layers 430d and 430e may increase. However, the transmittance of the light passing through the optical pattern layers 430d and 430e may be improved. Therefore, the angle 432-AG may be determined in consideration of the correlation between the accuracy of fingerprint recognition and the transmittance.

In an embodiment, the angle 432-AG between the bottom surface 432BS and the side surface 432SS may be in a range of about 85 degrees –95 degrees. For example, when an increased accuracy of fingerprint recognition is required, the angle 432-AG may be in a range of about 85 degrees –90 degrees. In addition, when increasing light transmittance is required, the angle 432-AG may be in a range of about 90 degrees –95 degrees.

Figure 14:
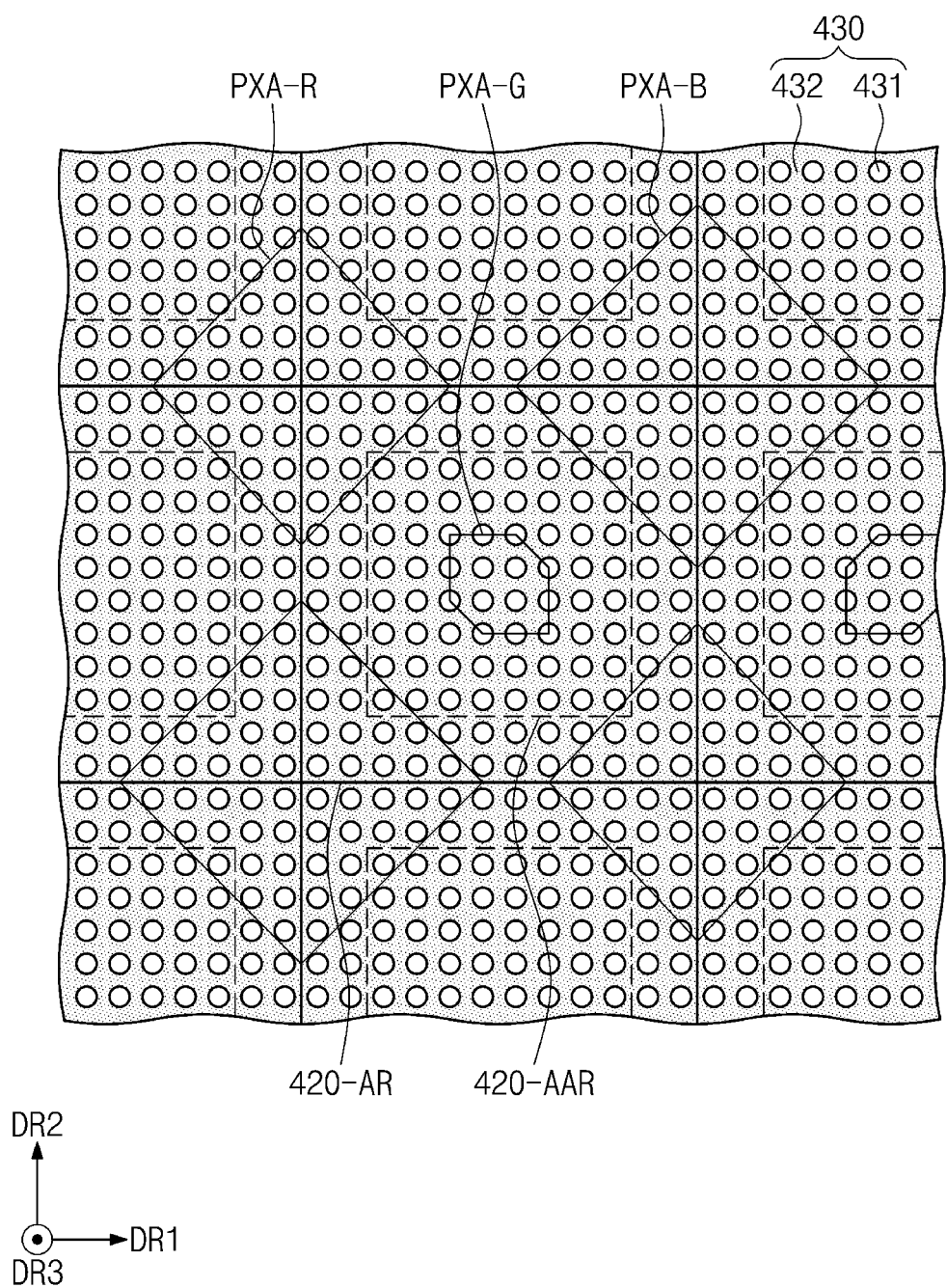
FIG. 14 is a plan view illustrating pixel areas, an optical pattern layer and detection areas of a display device according to an embodiment of the present inventive concepts.

FIG. 14 is a plan view illustrating a relationship between some components of a display device.

Referring to FIG. 14, pixel areas PXA-R, PXA-G, and PXA-B, an optical pattern layer 430, and a detection area 420-AR are illustrated.

Each of the pixel areas PXA-R, PXA-G, and PXA-B may correspond to the pixel area PXA shown in FIG. 5. For example, the pixel areas PXA-R, PXA-G, and PXA-B may include a first pixel area PXA-R, a second pixel area PXA-G, and a third pixel area PXA-B. In an embodiment, the first pixel area PXA-R is an area providing red light, the second pixel area PXA-G is an area providing green light, and the third pixel area PXA-B is an area providing blue light. However, embodiments of the present inventive concepts are not limited thereto.

As shown in the embodiment of FIG. 14, an area of the second pixel area PXA-G (e.g., an area in a plane formed by the first direction DR1 and second direction DR2) may be smaller than an area of the first pixel area PXA-R and an area of the third pixel area PXA-B. In addition, an area of the third pixel area PXA-B may be larger than an area of the first pixel area PXA-R and an area of the second pixel area PXA-G.

The detection area 420-AR includes one detection element 420-PD (see FIG. 6) and a valid detection area 420-AAR where the transistor 420-T (see FIG. 6) is electrically connected to one detection element 420-PD, and may also include a peripheral area surrounding the valid detection area 420-AAR.

In an embodiment of the present inventive concepts, one detection area 420-AR may overlap the plurality of pixel areas. For example, one detection area 420-AR may overlap at least some portions of two first pixel areas PXA-R, one second pixel area PXA-G, and at least some portions of two third pixel areas PXA-B.

In an embodiment of the present inventive concepts, each of the first to third pixel areas PXA-R, PXA-G, and PXA-B may overlap the plurality of transmission portions 431 (e.g., in the third direction DR3). For example, each of the first electrodes 313-E1 (see FIG. 5) disposed in the first to third pixel areas PXA-R, PXA-G, and PXA-B also overlaps the plurality of transmission portions 431.

The number of transmission portions 431 overlapping each of the first to third pixel areas PXA-R, PXA-G, and PXA-B may vary depending on the area of each of the first to third pixel areas PXA-R, PXA-G, and PXA-B. For example, in an embodiment, the number of transmission portions 431 overlapping the third pixel area PXA-B may be the largest, the number of transmission portions 431 overlapping the first pixel area PXA-R may be the second largest, and the number of transmission portions 431 overlapping the second pixel area PXA-G may be the fewest.

In an embodiment of the present inventive concepts, the detection area 420-AR may overlap the plurality of transmission portions 431 (e.g., in the third direction DR3). An embodiment in which the pitch between adjacent valid detection areas 420-AAR is 50 micrometers will be described. In this embodiment, the horizontal length of the detection area 420-AR may be 50 micrometers and the vertical length may be 50 micrometers. If the pitch of the transmission portions 431 is 3 micrometers, one detection area 420-AR may overlap 256 transmission portions 431. In addition, if the pitch of the transmission portions 431 is 4 micrometers, one detection area 420-AR may overlap 144 transmission portions 431. In addition, if the pitch of the transmission portions 431 is 5 micrometers, one detection area 420-AR may overlap 100 transmission portions 431.

An area of each of the first to third pixel areas PXA-R, PXA-G, and PXA-B may be less than the area of the detection area 420-AR. Therefore, the number of transmission portions 431 overlapping the first to third pixel areas PXA-R, PXA-G, and PXA-B, respectively, may be less than the number of transmission portions 431 overlapping the detection area 420-AR. In addition, the number of transmission portions 431 overlapping the first electrode 313-E1 (see FIG. 5) may be less than the number of transmission portions 431 overlapping the second detection electrodes 420-E2 (see FIG. 6).

Figure 15:
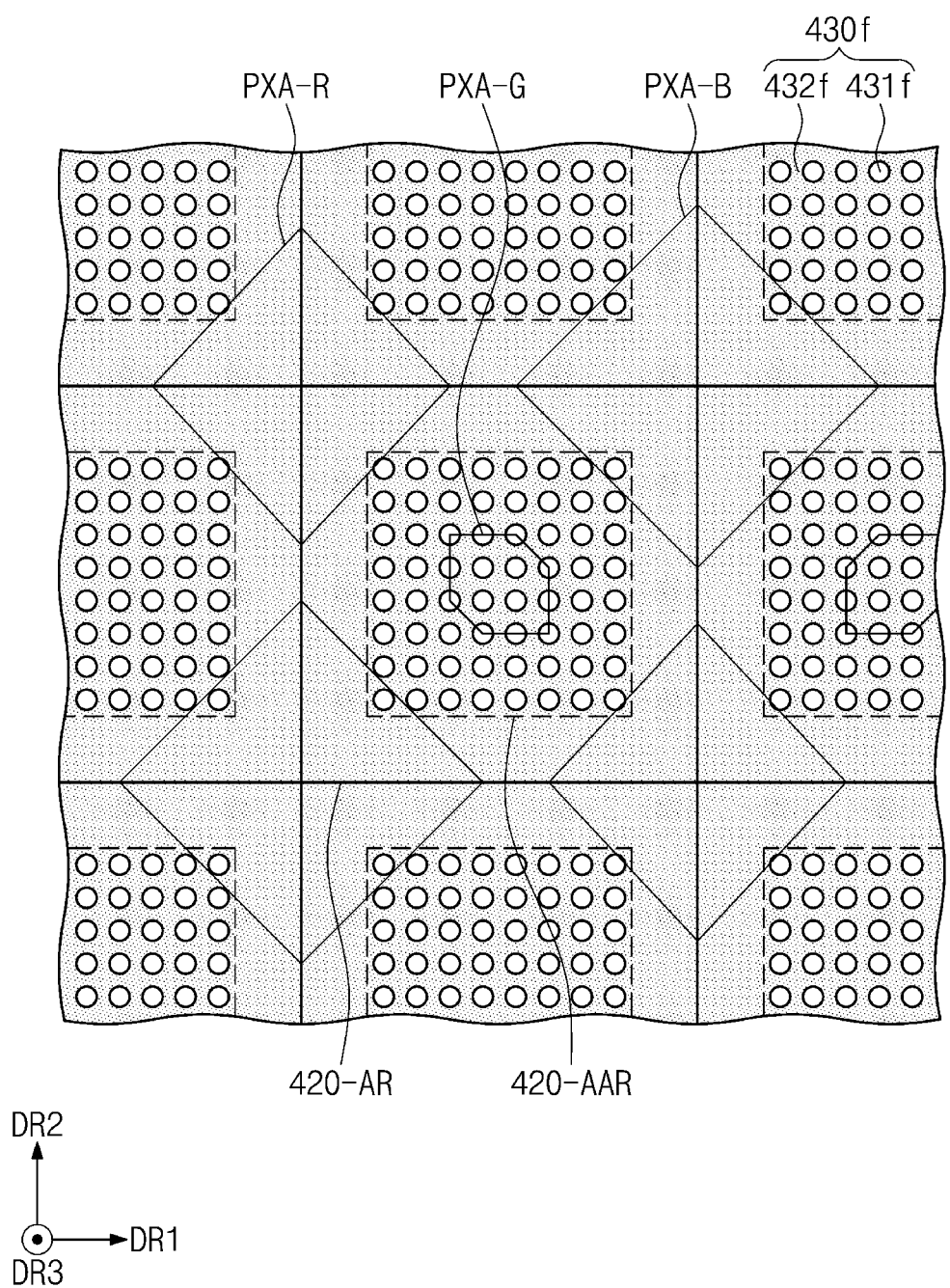
FIG. 15 is a plan view illustrating pixel areas, an optical pattern layer and detection areas of a display device according to an embodiment of the present inventive concepts.

FIG. 15 is a plan view illustrating a relationship between some components of a display device.

Referring to FIG. 15, pixel areas PXA-R, PXA-G, and PXA-B, an optical pattern layer 430f, and a detection area 420-AR are illustrated.

The optical pattern layer 430f may include transmission portions 431f and a light blocking portion 432f. In an embodiment of the present inventive concepts, the transmission portions 431f may be provided only in an area overlapping the valid detection area 420-AAR (e.g., in the third direction DR3). For example, the transmission portions 431f may not be provided on the outermost portion of the detection area 420-AR.

As shown in the embodiment of FIG. 15, at least a portion of the detection area 420-AR on a plane (e.g., a plane defined by the first direction DR1 and second direction DR2) may be covered by the light blocking portion 432f. For example, the transmission portions 431f may be disposed only on the valid detection area 420-AAR among the detection areas 420-AR. The detection element 420-PD (see FIG. 6) may be disposed in the valid detection area 420-AAR.

For example, in an embodiment, the horizontal and vertical lengths of the valid detection area 420-AAR may be 36 micrometers. If the pitch of the transmission portions 431f is 3 micrometers, one detection area 420-AR may overlap 144 transmission portions 431f. In addition, if the pitch of the transmission portions 431f is 4 micrometers, one detection area 420-AR may overlap 81 transmission portions 431f. In addition, if the pitch of the transmission portions 431f is 5 micrometers, one detection area 420-AR may overlap 49 transmission portions 431f.

According to embodiments of the present inventive concepts, the light reflected from the fingerprint may pass through the optical pattern layer and may be incident to the sensor. The incidence angle of light that may pass through the optical pattern layer may be limited to a predetermined angle or less by the optical pattern layer. As the incidence angle is limited, the accuracy of fingerprint recognition may be improved.

In addition, according to embodiments of the present inventive concepts, the optical pattern layer may be disposed directly on the sensor. Thus, the distance between the optical pattern layer and the detection electrode of the sensor may be reduced. As a result, the occurrence of interference between lights passing through the optical pattern layer may be prevented or reduced, so that the accuracy of fingerprint recognition may be improved.

Although embodiments of the present inventive concept have been described, it is understood that the present inventive concepts are not limited to these embodiments but various changes and modifications may be made by one ordinary skilled in the art within the spirit and scope of the inventive concepts as hereinafter claimed.

What is claimed is:
1. A display device comprising:
a sensor including a transistor and a detection electrode electrically connected to the transistor, the detection electrode comprising a continuous electrode body;
an optical pattern layer disposed on the sensor and including a plurality of transmission portions and a light blocking portion; and
a display panel disposed on the optical pattern layer and including first electrodes disposed in a plurality of pixel areas, respectively,
wherein each of the first electrodes overlaps at least two of the plurality of transmission portions,
wherein the detection electrode overlaps X transmission portions among the plurality of transmission portions on a plane, wherein X is a positive integer greater than or equal to three, and
wherein each of the first electrodes overlaps with fewer than the X transmission portions among the plurality of transmission portions on the plane.

2. The display device of claim 1, wherein a height of the light blocking portion is larger than or equal to 1/tan(AG) times of a width of each of the plurality of transmission portions and less than or equal to five times the width of each of the plurality of transmission portions.

3. The display device of claim 1, wherein the optical pattern layer further comprises a transmission layer disposed between the plurality of transmission portions and the sensor and between the light blocking portion and the sensor in a thickness direction of the display device.

4. The display device of claim 3, wherein the transmission layer comprises a same material as a material of the plurality of transmission portions.

5. The display device of claim 1, wherein an angle between a bottom surface of the light blocking portion and a side surface of the light blocking portion is in a range of 85 degrees-90 degrees or 90 degrees-95 degrees.

6. The display device of claim 1, wherein the plurality of transmission portions are arranged along a first direction and a second direction on a plane, and the light blocking portion surrounds the plurality of transmission portions.

7. The display device of claim 1, wherein the plurality of transmission portions include first transmission portions comprising a first transmission arrangement and second transmission portions comprising a second transmission arrangement,
wherein the first transmission portions and the second transmission portions are arranged along a first direction, respectively,
wherein the first transmission arrangement and the second transmission arrangement are alternately arranged along a second direction that intersects the first direction,
wherein centers of the first transmission portions do not overlap centers of the second transmission portions in the second direction.

8. The display device of claim 1, wherein the plurality of transmission portions comprise a central transmission portion and six peripheral transmission portions adjacent to the central transmission portion and spaced at a same pitch from the central transmission portion.

9. The display device of claim 1, further comprising an additional optical pattern layer disposed on the optical pattern layer and including a plurality of additional transmission portions and an additional light blocking portion.

10. The display device of claim 9, wherein each of the plurality of transmission portions extends along a first direction, and each of the plurality of additional transmission portions extends along a second direction intersecting the first direction.

11. The display device of claim 1, wherein the display panel comprises:
a base layer;
a circuit layer disposed on the base layer and including a pixel circuit; and
a light emitting element layer disposed on the circuit layer, and including a first light emitting element electrode of the first electrodes, a light emitting layer disposed on the first light emitting element electrode, and a second electrode disposed on the light emitting layer and overlapping the plurality of first electrodes,
wherein the first light emitting element electrode and the second electrode have transparency, and the first light emitting element electrode overlaps Y transmission portions among the plurality of transmission portions, wherein Y is a positive integer greater than or equal to two.

12. The display device of claim 1, further comprising an infrared filter disposed between the display panel and the optical pattern layer in a thickness direction of the display device.

13. A display device of claim 1, wherein:
an active area for displaying an image and a peripheral area surrounding the active area are defined in the display panel;
a detection area for detecting biometric information is defined in the sensor; and
the detection area overlaps an entire portion of the active area.

14. A display device comprising:
a detection unit having a sensor that includes a transistor and, a detection electrode electrically connected to the transistor, and an optical pattern layer that is disposed on the sensor and includes a plurality of transmission portions and a light blocking portion adjacent to the plurality of transmission portions, the detection electrode comprising a continuous electrode boy; and
a display panel disposed on the detection unit and including a light emitting element layer having a first electrode, a light emitting layer disposed on the first electrode, and a second electrode disposed on the light emitting layer,
wherein each of the first electrode and the detection electrode overlaps at least two or more transmission portions among the plurality of transmission portions,
wherein the plurality of transmission portions do not overlap each other, and
wherein a number of transmission portions overlapping the detection electrode among the plurality of transmission portions is greater than a number of transmission portions overlapping the first electrode among the plurality of transmission portions.

15. The display device of claim 14, wherein a minimum distance between the detection electrode and the light blocking portion is in a range of 1 micrometer-5 micrometers.

16. The display device of claim 14, wherein:
the optical pattern layer further comprises a transmission layer disposed between the plurality of transmission portions and the sensor and between the light blocking portion and the sensor in a thickness direction of the display device; and
the transmission layer comprises a same material as a material of the plurality of transmission portions.

17. The display device of claim 14, wherein a height of the light blocking portion is larger than or equal to 1/tan(AG) times of a width of each of the plurality of transmission portions and less than or equal to five times of the width of each of the plurality of transmission portions,
wherein AG is an incidence angle of light on the optical pattern layer,
wherein an angle between a bottom surface of the light blocking portion and a side surface of the light blocking portion is in a range of 85 degrees-90 degrees or 90 degrees-95 degrees.

18. The display device of claim 14, wherein the plurality of transmission portions comprise a central transmission portion and six peripheral transmission portions adjacent to the central transmission portion and spaced at a same pitch from the central transmission portion.

19. A display device comprising:
a display panel having a plurality of pixel areas including a first pixel area, a second pixel area and a third pixel area, each of the plurality of pixel areas having a pixel that includes a first electrode, a light emitting layer disposed on the first electrode and a second electrode disposed on the light emitting layer, a detection unit disposed under the display panel, the detection unit having a sensor that includes a transistor and a detection element electrically connected to the transistor, wherein the detection unit forms a detection area overlapping the detection element, the detection elemment comprising a continuous electrode body;

an optical pattern layer disposed on the sensor and including a plurality of transmission portions and a light blocking portion adjacent to the plurality of transmission portions;

wherein the detection area overlaps at least three of the plurality of transmission portions, wherein the detection area overlaps both a portion of the first pixel area, a portion of the second pixel area and a portion of the third pixel area;

wherein the first electrodes of the first pixel area, second pixel area and third pixel area overlap at least two of the plurality of transmission portions; and wherein a number of transmission portions overlapping the first electrodes of the first pixel area, second pixel area and third pixel area, respectively, is less than a number of transmission portions overlapping each of the detection areas.

20. The display device of claim 19, wherein:

the detection area comprises a valid detection area and a peripheral area; and the plurality of transmission portions only overlap the valid detection area and does not overlap with the peripheral area.

\* \* \* \* \*